(12) United States Patent
Li et al.

(10) Patent No.: US 11,050,003 B2
(45) Date of Patent: *Jun. 29, 2021

(54) NARROW-BAND RED PHOSPHORS FOR LED LAMPS

(71) Applicant: Intematix Corporation, Fremont, CA (US)

(72) Inventors: Yi-Qun Li, Danville, CA (US); Gang Wang, Sunnyvale, CA (US)

(73) Assignee: Intematix Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/742,910

(22) Filed: Jan. 14, 2020

(65) Prior Publication Data

US 2020/0176646 A1 Jun. 4, 2020

Related U.S. Application Data

(63) Continuation of application No. 15/870,705, filed on Jan. 12, 2018, now Pat. No. 10,535,805, which is a
(Continued)

(51) Int. Cl.
*F21V 21/00* (2006.01)
*H01L 33/50* (2010.01)
(Continued)

(52) U.S. Cl.
CPC .......... *H01L 33/502* (2013.01); *C09K 11/886* (2013.01); *F21K 9/232* (2016.08);
(Continued)

(58) Field of Classification Search
CPC ..... H01L 33/502; H01L 33/504; F21K 9/232; F21K 9/234; C09K 11/886; F21V 31/00;
(Continued)

(56) References Cited

U.S. PATENT DOCUMENTS 9,967,943 B1    5/2018  Wang et al.
10,026,874 B1 * 7/2018  Li ........................ F21K 9/237
(Continued)

FOREIGN PATENT DOCUMENTS

CN    1719633 A    1/2006
CN    1818012 A    8/2006
(Continued)

OTHER PUBLICATIONS

TW Office Action, dated Oct. 2020, App. No. 109109011.
(Continued)

*Primary Examiner* — Laura K Tso
(74) *Attorney, Agent, or Firm* — CrossPond Law

(57) ABSTRACT

A light emitting device (LED-Filament) comprises: a light-transmissive substrate; at least one blue LED chip mounted on the light-transmissive substrate, for instance mounted on a face thereof; and a photoluminescence material at least partially covering the at least one blue LED chip. The photoluminescence material comprises narrow-band red phosphor particles that generates light with a peak emission wavelength in a range of 600 nm to 640 nm and a full width at half maximum emission intensity of 50 nm to 60 nm. The light emitting device is characterized by CRI Ra greater than or equal to about 90. The narrow-band red phosphor particles can comprise at least one Group IIA/IIB selenide sulfide-based phosphor material such as for example $CaSe_{1-x}S_x:Eu$ (CSS phosphor). The LED-filament can be incorporated in a lamp, with a yellow to green-emitting phosphor that generates light with a peak emission wavelength in a range of 520 nm to 570 nm, to provide light with a color temperature in a range of 1500 K to 4000 K or 1500 K to 6500 K and a General Color Rendering Index (CRI Ra) greater than or equal to about 90 and a CRI R9 greater than or equal to about 50.

13 Claims, 21 Drawing Sheets

SECTION A - A

Related U.S. Application Data continuation-in-part of application No. 15/853,756, filed on Dec. 23, 2017, now abandoned, which is a continuation of application No. 15/653,317, filed on Jul. 18, 2017, now Pat. No. 10,026,874, which is a continuation of application No. 15/588,262, filed on May 5, 2017, now abandoned.

(60) Provisional application No. 62/446,330, filed on Jan. 13, 2017.

(51) Int. Cl.

| | | |
|---|---|---|
| *C09K 11/88* | (2006.01) | |
| *F21K 9/232* | (2016.01) | |
| *F21V 31/00* | (2006.01) | |
| *F21K 9/237* | (2016.01) | |
| *F21V 19/00* | (2006.01) | |
| *F21V 3/10* | (2018.01) | |
| *F21V 3/06* | (2018.01) | |
| *F21Y 103/10* | (2016.01) | |
| *F21Y 115/10* | (2016.01) | |

(52) U.S. Cl.
CPC .............. *F21V 31/00* (2013.01); *F21K 9/237* (2016.08); *F21V 3/0615* (2018.02); *F21V 3/10* (2018.02); *F21V 19/005* (2013.01); *F21Y 2103/10* (2016.08); *F21Y 2115/10* (2016.08); *H01L 33/504* (2013.01)

(58) Field of Classification Search
CPC ...... F21V 31/10; F21V 3/0615; F21V 19/005; F21Y 2103/10; F21Y 2115/10
USPC .......................................................... 362/84
See application file for complete search history.

(56) References Cited

U.S. PATENT DOCUMENTS

| | | | |
|---|---|---|---|
| 10,535,805 B2* | 1/2020 | Li ........................... | F21V 31/00 |
| 2004/0124758 A1 | 7/2004 | Danielson et al. | |
| 2007/0125984 A1 | 6/2007 | Tian et al. | |
| 2007/0139949 A1 | 6/2007 | Tanda et al. | |
| 2010/0142189 A1 | 6/2010 | Hong et al. | |
| 2010/0254139 A1* | 10/2010 | Juang .................... | F21V 19/003 |
| | | | 362/249.02 |
| 2010/0289044 A1* | 11/2010 | Krames ................. | C09K 11/08 |
| | | | 257/98 |
| 2011/0163683 A1* | 7/2011 | Steele ..................... | F21V 7/06 |
| | | | 315/192 |
| 2012/0032219 A1 | 2/2012 | Ooyabu et al. | |
| 2012/0217862 A1 | 8/2012 | Matsuda et al. | |
| 2012/0306340 A1 | 12/2012 | Hoetzl et al. | |
| 2014/0167601 A1 | 6/2014 | Harry et al. | |
| 2015/0069442 A1 | 3/2015 | Liu et al. | |
| 2016/0233393 A1 | 8/2016 | Okuno et al. | |
| 2016/0351757 A1 | 12/2016 | Yoshimura et al. | |
| 2018/0219144 A1 | 8/2018 | Perkins et al. | |
| 2018/0315899 A1 | 11/2018 | Li et al. | |
| 2018/0328543 A1 | 11/2018 | Bergmann et al. | |

FOREIGN PATENT DOCUMENTS

| | | | |
|---|---|---|---|
| CN | 103547858 | A | 1/2014 |
| CN | 102439682 | B | 3/2016 |
| CN | 103717701 | B | 8/2016 |
| CN | 205542866 | U | 8/2016 |
| DE | 102016105211 | A1 | 9/2017 |
| EP | 2747157 | B1 | 3/2016 |
| EP | 3226313 | A1 | 10/2017 |
| EP | 3279952 | A1 | 2/2018 |
| EP | 2629341 | | 4/2020 |
| KR | 101683270 | B1 | 12/2016 |
| TW | 201306318 | A | 2/2013 |
| TW | M467186 | U | 12/2013 |
| TW | 201510440 | A | 3/2015 |
| WO | 2010053341 | A1 | 5/2010 |
| WO | 2019005597 | A1 | 1/2019 |

OTHER PUBLICATIONS

International Search Report, PCT/US2020/023187.
IPRP, dated Jul. 2020; PCT/US18/65952.
Written Opinion of the International Search Authority, PCT/US2020/023187.
European Search Opinion, dated Jul. 2020, EP18738546.
International Search Report, PCT/US2020/023095.
International Search Report, PCT/US2020/023110.
Supplementary European Search Report, dated Jul. 2020, EP18738546.
Written Opinion of the International Search Authority, PCT/US2020/023095.
Written Opinion of the ISA, PCT/US2020/023110.
Office Action dated Mar. 18, 2020; CN app. No. 201880007010.4.
Office Action, TW109109069, dated Oct. 30, 2020.
Search Report, TW109109012, dated Jan. 2021.

* cited by examiner

SECTION A - A

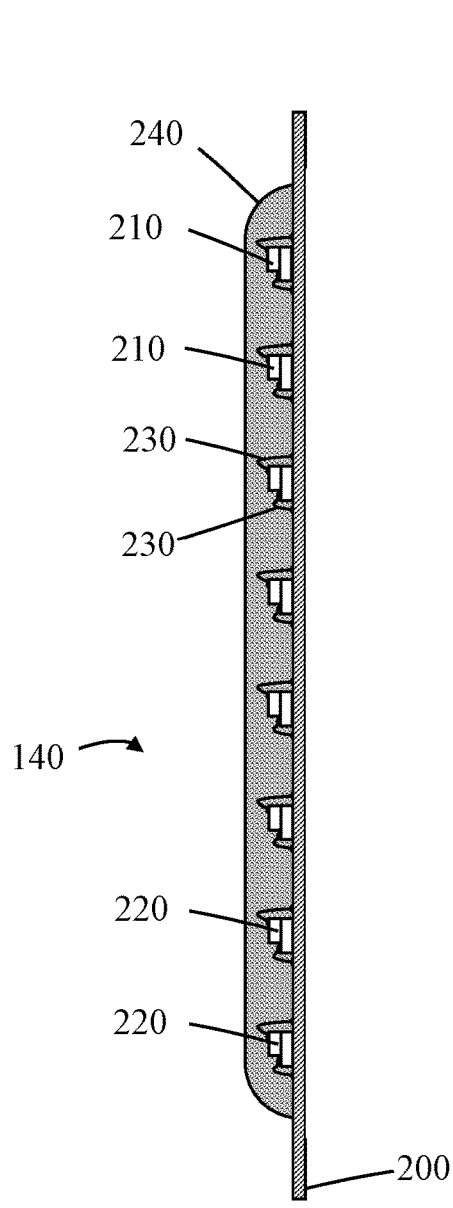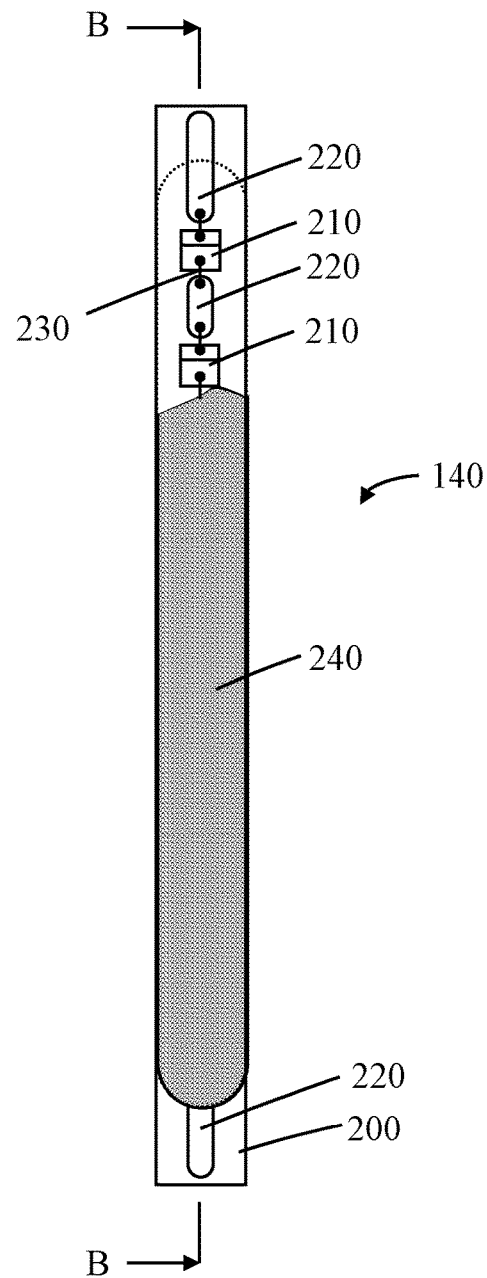
SECTION B-B
FIG. 4A
FIG. 4B

SECTION C-C

US 11,050,003 B2

NARROW-BAND RED PHOSPHORS FOR LED LAMPS

CROSS-REFERENCE TO RELATED APPLICATIONS

This patent application is a continuation of U.S. patent application Ser. No. 15/870,705, filed Jan. 12, 2018, now U.S. Pat. No. 10,535,805, which is a continuation in part of U.S. patent application Ser. No. 15/853,756, filed Dec. 23, 2017 which is a continuation of U.S. patent application Ser. No. 15/653,317, filed Jul. 18, 2017, now U.S. Pat. No. 10,026,874, which is a continuation of U.S. patent application Ser. No. 15/588,262, filed May 5, 2017 which claims the benefit of priority to U.S. Provisional Patent Application No. 62/446,330, filed 13 Jan. 2017, all of which are hereby incorporated by reference herein in their entirety.

FIELD OF THE INVENTION

Embodiments of the present invention are directed to narrow-band red phosphors for LED devices and lamps, and more particularly, but not exclusively, to Group IIA/IIB selenide sulfide-based phosphor materials for LED-filaments and LED-filament lamps.

BACKGROUND OF THE INVENTION

White light emitting LEDs ("white LEDs") include one or more photoluminescence materials (typically inorganic phosphor materials), which absorb a portion of the blue light emitted by the LED and re-emit light of a different color (wavelength). The portion of the blue light generated by the LED that is not absorbed by the phosphor material combined with the light emitted by the phosphor provides light which appears to the eye as being white in color. Due to their long operating life expectancy (>50,000 hours) and high luminous efficacy (100 lm/W and higher) white LEDs are rapidly being used to replace conventional fluorescent, compact fluorescent and incandescent lamps. LED lamps (bulbs) are typically constructed from a small number of high-intensity white LEDs.

Recently, LED-filament lamps have been developed that comprise LED-filaments that closely resemble the filament of a traditional incandescent lamp. The LED-filaments, which are typically about an inch long, comprise COG (Chip-On-Glass) devices having a plurality of low-power LED chips mounted on a transparent glass substrate. The LED-filaments are encased in a phosphor-impregnated encapsulant, such as silicone. Typically, LED-filament lamps are configured to generate "warm white" light with a CCT (Correlated Color Temperature) of 2700 K to 3000 K with a General Color Rendering Index (CRI Ra) of up to about 80.

While the CRI Ra of packaged white LEDs can be increased by including a longer wavelength red emitting phosphor while experiencing only a small reduction in performance, when a longer wavelength red emitting phosphor is included in a LED-filament to increase CRI Ra from 80 to 90 this results in a substantial reduction in performance, in particular luminous efficacy, of the LED-filament in a range from 15% to 20%. The reduction in efficacy results in greater heat generation within the LED-filament. Since there is no way of readily managing an increase in heat in an LED-filament, this makes it impractical to produce high lumen (>800 lm) CRI Ra 90 LED-filaments with an acceptable luminous efficacy. There is thus a need to provide LED-Filaments and LED-filament lamps that have a CRI Ra of at least about 90 and which have substantially the same performance as a CRI Ra 80 LED-filament.

SUMMARY OF THE INVENTION

Embodiments of the invention concern LED-filaments and LED-filament lamps that comprise a narrow-band red phosphor that generates red light with a peak emission wavelength in a range of 600 nm to 640 nm and a full width at half maximum emission intensity of about 50 nm to about 60 nm. In some embodiments, the narrow-band red phosphor can comprise particles of at least one Group IIA/IIB selenide sulfide-based phosphor material, such as for example $CaSe_{1-x}S_x$:Eu (CSS phosphor). Compared with known LED-filament lamps comprising a CASN red nitride phosphor (Calcium Aluminum Silicon Nitride of general composition $CaAlSiN_3$:$Eu^{2+}$), LED-filaments and LED-filament lamps in accordance with the invention comprising a narrow-band red phosphor are found to be capable of generating light having i) a CRI Ra of about 90 and greater, ii) a CRI R9 up to about 55, iii) a CRI R8 of about 72 and greater, and iv) substantially the same efficacy as CRI Ra 80 LED-filament lamps comprising a CASN phosphor. Moreover, said narrow-band red phosphors (for example, Group IIA/IIB selenide sulfide-based phosphor material) may be capable of providing light emitting devices/LED-filaments having a CRI Ra of at least 90 and a performance (e.g. luminous efficacy) comparable to that of existing 80 CRI Ra devices/LED-Filaments.

According to an embodiment, a light emitting device comprises: a light-transmissive substrate; at least one blue LED chip mounted on the light-transmissive substrate (for example, on a face of the light-transmissive substrate); and a photoluminescence material at least partially covering the at least one blue LED chip, the photoluminescence material comprising narrow-band red phosphor particles that generate light with a peak emission wavelength in a range of 600 nm to 640 nm and a full width at half maximum emission intensity of 50 nm to 60 nm. The light emitting device can be characterized by a CRI Ra greater than or equal to about 90. Moreover, the light emitting device can be further characterized by at least one of a CRI R9 greater than or equal to about 50 and a CRI R8 greater than or equal to about 72. The photoluminescence material can completely cover exposed light emitting surfaces of the at least one blue LED chip. The phosphor particles can generate light with a peak emission wavelength in a range 624 nm to 635 nm. In some embodiments, the phosphor particles generate light with a peak emission wavelength in a range 624 nm to 628 nm. In some embodiments, the phosphor particles generate light with a peak emission wavelength of about 626 nm.

The narrow-band red phosphor particles can comprise at least one Group IIA/IIB selenide sulfide-based phosphor material. In an embodiment, the Group IIA/IIB selenide sulfide-based phosphor material has a composition $MSe_{1-x}S_x$:Eu, wherein M is at least one of Mg, Ca, Sr, Ba and Zn and $0<x<1.0$. In other embodiments, the Group IIA/IIB selenide sulfide-based phosphor material can have a composition $MS_xSe_yA_z$:Eu, wherein M is at least one of Mg, Ca, Sr and Ba, A comprises one or more of carbon, nitrogen, boron, phosphorous and a monovalent combining group NCN (cyanamide), $0<z\leq0.05$, and $0.8<x+y<1.25$.

To improve reliability of the light emitting device, the phosphor particles can comprise a dense impermeable coating on individual ones of said phosphor particles. The dense impermeable coating material can comprise one or more materials such as for example aluminum oxide, silicon oxide, titanium oxide, zinc oxide, magnesium oxide, zirconium oxide, boron oxide, chromium oxide, calcium fluoride, magnesium fluoride, zinc fluoride, aluminum fluoride and/or titanium fluoride. In some embodiments, the coating material can comprise amorphous alumina.

In some embodiments, the narrow-band red phosphor particles (for example Group IIA/IIB selenide sulfide-based phosphor particles) can comprise first particles with a first peak emission wavelength and second particles with a second peak emission wavelength. In some embodiments, the first peak emission wavelength is in a range of 624 nm to 628 nm and the second peak emission wavelength is in a range of 630 nm to 638 nm. LED-filaments and LED-filament lamps that comprise a mixture of at least two narrow-band red phosphor particles (for example Group IIA/IIB selenide sulfide-based phosphor particles) having different peak emission wavelengths can, compared with an LED-filament comprising a single narrow-band red phosphor, have a more stable chromaticity (quality of light color) during the stabilization period after lamp turn-on, increase the luminous efficacy while still maintaining a CRI Ra of at least 90 and exhibit only a minimal decrease in CRI R9. In an embodiment, the first peak emission wavelength is about 626 nm and the second peak emission wavelength is about 634 nm. In embodiments comprising first and second phosphor particles, the light emitting device can be characterized by at least one of a CRI Ra greater than or equal to about 90, a CRI R9 greater than or equal to about 50 and a CRI R8 greater than or equal to about 72.

The photoluminescence material can further comprise particles of a yellow to green-emitting phosphor that generate light with a peak emission wavelength in a range of 520 nm to 570 nm. In some embodiments, the yellow to green-emitting phosphor generates light with a peak emission wavelength in a range of 520 nm to 540 nm. The yellow to green-emitting photoluminescence material can comprise a GYAG (Green-emitting YAG) phosphor of general composition $Y_3(Al,Ga)_5O_{12}$:Ce and/or comprise a GAL (Green Aluminate) phosphor of general composition $Lu_3Al_5O_{12}$:Ce.

Typically, the at least one blue LED chip comprises an array of blue LED chips such as for example a linear array of blue LED chips. For instance, the array of blue LED chips may be located on the light-transmissive substrate, such as a first face of the light-transmissive substrate. In some embodiments, the light emitting device further comprises at least one second LED chip or array of second LED chips mounted on the light-transmissive substrate, said photoluminescence material at least partially covering said at least one or array of second blue LED chips. For instance, the at least one second LED chip or array of second LED chips may be located on a second face of the light-transmissive substrate. The light-transmissive substrate can have a transmittance in a range of 20% to 100% in the visible light spectrum and can comprise magnesium oxide, sapphire, aluminum oxide, quartz glass, aluminum nitride or diamond. The light-transmissive substrate can be elongate in form, for example linear. The photoluminescence material can completely cover said at least one or array of second blue LED chips.

According to an embodiment, a lamp comprises: a light-transmissive envelope; and at least one light emitting device located within the light-transmissive envelope, the light emitting device comprising: (1) a light-transmissive substrate; (2) at least one blue LED chip mounted on the light-transmissive substrate, for instance, mounted on a face thereof; and (3) a photoluminescence material at least partially covering the at least one blue LED chip, the photoluminescence material comprising: (a) phosphor particles of a narrow-band red phosphor that generate light with a peak emission wavelength in a range of 600 nm to 640 nm and a full width at half maximum emission intensity of 50 nm to 60 nm; and (b) phosphor particles of a yellow to green-emitting phosphor that generate light with a peak emission wavelength in a range of 520 nm to 570 nm; wherein the lamp is operable to generate light with a color temperature in a range of 1500 K to 4000 K or 1500 K to 6500 K and a CRI Ra greater than or equal to about 90. The lamp can be further characterized by generating light with at one of a CRI R9 greater than or equal to about 50 and a CRI R8 greater than or equal to about 72. The photoluminescence material can completely cover said at least one blue LED chip.

It will be appreciated that in the embodiments described herein, the (first/second) at least one blue LED chip or (first/second) array of blue LED chips may be mounted on a first or second face of the light-transmissive substrate. This contemplates LED devices, LED filaments and LED filament lamps.

In an embodiment, the narrow-band red phosphor comprises a Group IIA/IIB selenide sulfide-based phosphor material. In some embodiments the Group IIA/IIB selenide sulfide-based phosphor material has a composition $MSe_{1-x}S_x$:Eu, wherein M is at least one of Mg, Ca, Sr, Ba and Zn and $0<x<1.0$. In other embodiments, the Group IIA/IIB selenide sulfide-based phosphor material can have a composition $MS_xSe_yA_z$:Eu, wherein M is at least one of Mg, Ca, Sr and Ba, A comprises one or more of carbon, nitrogen, boron, phosphorous and a monovalent combining group NCN (cyanamide), $0<z≤0.05$, and $0.8<x+y<1.25$.

The narrow-band red phosphor particles can generate light with a peak emission wavelength in a range of 624 nm to 635 nm. In some embodiments, the narrow-band red phosphor particles generate light with a peak emission wavelength in a range of 624 nm to 628 nm. In some embodiments, the narrow-band red phosphor particles generate light with a peak emission wavelength of about 626 nm.

To improve reliability of the light emitting device, the Group IIA/IIB selenide sulfide-based phosphor particles phosphor particles can comprise a dense impermeable coating on individual ones of said phosphor particles. The dense impermeable coating can comprise one or more materials such as for example aluminum oxide, silicon oxide, titanium oxide, zinc oxide, magnesium oxide, zirconium oxide, boron oxide, chromium oxide, calcium fluoride, magnesium fluoride, zinc fluoride, aluminum fluoride and/or titanium fluoride. In some embodiments, the coating material can comprise amorphous alumina.

In some embodiments, the narrow-band red phosphor particles can comprise first particles with a first peak emission wavelength and second particles with a second peak emission wavelength. In some embodiments, the first peak emission wavelength is in a range of 624 nm to 628 nm and the second peak emission wavelength is in a range of 630 nm to 638 nm. In an embodiment, the first peak emission wavelength is about 626 nm and the second peak emission wavelength is about 634 nm. In embodiments comprising first and second particles, the light emitting device can be characterized by a CRI Ra greater than or equal to 90 and a CRI R9 greater than or equal to 50.

In some embodiments, the yellow to green-emitting phosphor particles generate the light with a peak emission wavelength in a range of 520 nm to 540 nm. The yellow to green-emitting phosphor particles can comprise a garnet structured material such as a GYAG phosphor (Green-emitting YAG) of general composition $Y_3(Al,Ga)_5O_{12}$:Ce and/or a GAL phosphor (Green ALuminate) of general composition $Lu_3Al_5O_{12}$:Ce.

In some embodiments, the light-transmissive envelope is filled with an inert gas, such as helium. Inclusion of an inert gas can aid in dissipating heat generated by the light emitting device.

Typically, the at least one blue LED chip comprises an array of blue LED chips such as for example a linear array of blue LED chips located on the light-transmissive substrate. It may be that the array of blue LED chips is mounted on a first face of the light-transmissive substrate. In some embodiments, the light emitting device further comprises at least one second LED chip, or an array of second LED chips, located on the light-transmissive substrate, said photoluminescence material at least partially covering said at least one second blue LED chip. The at least one second LED chip or the array of second LED chips may be located on a second face of the light-transmissive substrate. The light-transmissive substrate can have a transmittance in a range of 20% to 100% in the visible light spectrum and can comprise magnesium oxide, sapphire, aluminum oxide, quartz glass, aluminum nitride or diamond. The light-transmissive substrate can be elongate in form, for example linear in form. The photoluminescence material can completely cover said at least one second blue LED chip.

According to another embodiment, a light emitting device comprises: a light-transmissive substrate; at least one blue LED chip mounted on the light-transmissive substrate, for instance mounted on a face thereof; and a photoluminescence material at least partially covering the at least one blue LED chip, the photoluminescence material comprising phosphor particles of two Group IIA/BB selenide sulfide-based phosphor materials; wherein the phosphor particles generate light with a peak emission wavelength in a range of 600 nm to 640 nm and a full width at half maximum emission intensity of 50 nm to 60 nm. The phosphor particles can comprise first particles with a first peak emission wavelength in a range of 624 nm to 628 nm and second particles with a second peak emission wavelength in a range of 630 nm to 638 nm. The photoluminescence material can completely cover exposed light emitting surfaces of the at least one blue LED chip.

According to another embodiment, a lamp comprises: a light-transmissive envelope; and at least one light emitting device located within the light-transmissive envelope, the light emitting device comprising: (1) a light-transmissive substrate; (2) at least one blue LED chip mounted on the light-transmissive substrate, for example mounted on a face thereof; and (3) a photoluminescence material at least partially covering the at least one blue LED chip, the photoluminescence material comprising: (a) phosphor particles of two narrow-band red phosphor materials that generates light with a peak emission wavelength in a range of 600 nm to 640 nm and a full width at half maximum emission intensity of 50 nm to 60 nm; and (b) phosphor particles of a yellow to green-emitting phosphor that generates light with a peak emission wavelength in a range of 520 nm to 570 nm; wherein the lamp is operable to generate light with a color temperature in a range of 1500 K to 4000 K or 1500 K to 6500 K and a CRI Ra greater than or equal to about 90. The lamp can be further characterized by generating light with at least one of a CRI R9 greater than or equal to about 50 and a CRI R8 greater than or equal to about 72. As with other embodiments, the narrow-band red phosphors can comprise a Group IIA/IIB selenide sulfide-based phosphor material such as for example those of composition $MSe_{1-x}S_x$:Eu, wherein M is at least one of Mg, Ca, Sr, Ba and Zn and $0<x<1.0$. The photoluminescence material can completely cover said at least one blue LED chip.

While the present invention finds particular utility in relation to LED-filaments and LED-filament lamps, it is found that narrow-band red phosphor, in particular Group IIA/BB selenide sulfide-based phosphor material such as for example $CaSe_{1-x}S_x$:Eu (CSS) phosphor materials, provide utility in other types of light emitting devices such as packaged LEDs to achieve a CRI Ra of 90 and higher. According to an embodiment a light emitting device comprises: at least one blue LED chip and a photoluminescence material at least partially covering the at least one blue LED chip, the photoluminescence material comprising narrow-band red phosphor particles that generate light with a peak emission wavelength in a range of 600 nm to 640 nm and a full width at half maximum emission intensity of 50 nm to 60 nm and wherein the light emitting device is characterized by a CRI Ra greater than or equal to about 90. Moreover, the light emitting device can be further characterized by at least one of a CRI R9 greater than or equal to 50 and a CRI R8 greater than or equal to about 72.

The narrow-band phosphor particles can generate light with a peak emission wavelength in a range of 624 nm to 635 nm. In some embodiments, the narrow-band red phosphor particles generate light with a peak emission wavelength of about 626 nm.

In some embodiments, the narrow-band red phosphor particles can comprise first particles with a first peak emission wavelength and second particles with a second peak emission wavelength. In some embodiments, the first peak emission wavelength is in a range of 624 nm to 628 nm and the second peak emission wavelength is in a range of 630 nm to 638 nm. Light emitting devices comprising a mixture of at least two narrow-band red phosphor particles having different peak emission wavelengths can, compared with light emitting devices comprising a single narrow-band red phosphor, have a more stable chromaticity (quality of light color), increase the luminous efficacy while still maintaining a CRI Ra of at least 90 and exhibit only a minimal decrease in CRI R9. In an embodiment, the first peak emission wavelength is about 626 nm and the second peak emission wavelength is about 634 nm.

The narrow-band red phosphor particles can comprise at least one Group IIA/IIB selenide sulfide-based phosphor material. In an embodiment, the Group IIA/IIB selenide sulfide-based phosphor material has a composition $MSe_{1-x}S_x$:Eu, wherein M is at least one of Mg, Ca, Sr, Ba and Zn and $0<x<1.0$. In other embodiments, the Group IIA/IIB selenide sulfide-based phosphor material can have a composition $MS_xSe_yA_z$:Eu, wherein M is at least one of Mg, Ca, Sr and Ba, A comprises one or more of carbon, nitrogen, boron, phosphorous and a monovalent combining group NCN (cyanamide), $0<z\leq0.05$, and $0.8<x+y<1.25$.

To improve reliability of the light emitting device, the narrow-band red phosphor particles can comprise a dense impermeable coating on individual ones of said phosphor particles. The dense impermeable coating material can comprise one or more materials such as for example aluminum oxide, silicon oxide, titanium oxide, zinc oxide, magnesium oxide, zirconium oxide, boron oxide, chromium oxide, calcium fluoride, magnesium fluoride, zinc fluoride, aluminum fluoride and/or titanium fluoride. In some embodiments, the coating material can comprise amorphous alumina.

The photoluminescence material can further comprise particles of a yellow to green-emitting phosphor that generate light with a peak emission wavelength in a range of 520 nm to 570 nm. In some embodiments, the yellow to green-emitting phosphor generates light with a peak emission wavelength in a range of 520 nm to 540 nm. The yellow to green-emitting photoluminescence material can comprise a GYAG (Green-emitting YAG) phosphor of general composition $Y_3(Al,Ga)_5O_{12}$:Ce and/or comprise a GAL (Green Aluminate) phosphor of general composition $Lu_3Al_5O_{12}$:Ce Typically, the at least one blue LED chip comprises a plurality of low power blue LED chips to reduce blue photon power density and thereby reduce the effects of blue quenching to improve device performance (in particular efficacy).

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein:

FIGS. 4A and 4B illustrates schematic cross-sectional B-B side and partial cutaway side views of an LED-filament in accordance with an embodiment of the invention for use in the lamp of FIGS. 3A and 3B;

DETAILED DESCRIPTION OF THE INVENTION

Figure 1:
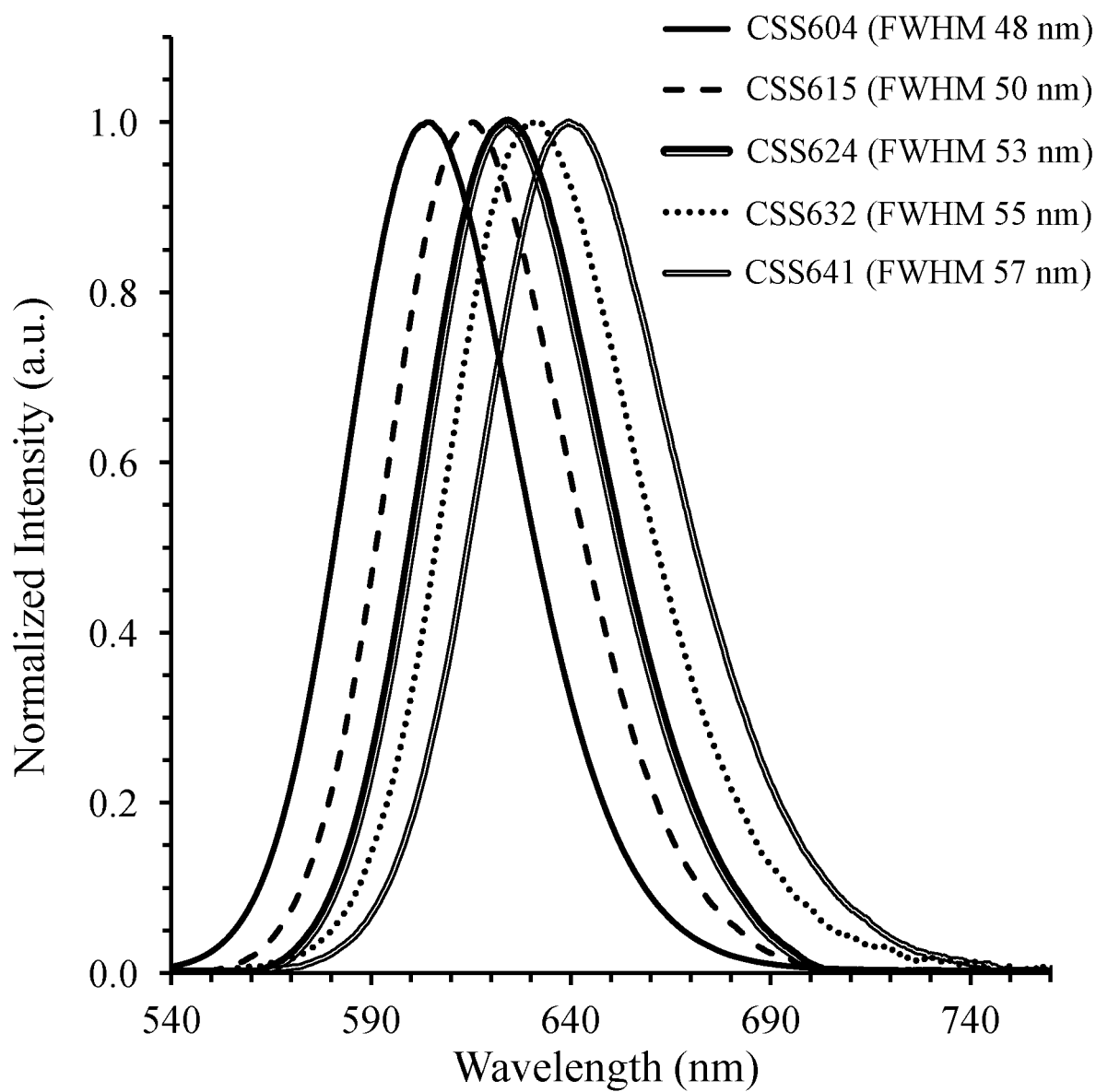
FIG. 1 shows normalized emission spectra of CSS ($CaSe_{1-x}S_x$:Eu) narrow-band red phosphors for differing ratios of S/Se.

Embodiments of the present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

Embodiments of the invention concern light emitting devices (LED-filaments) and LED-filament lamps comprising a narrow-band red phosphor that generates light with a peak emission wavelength in a range of 600 nm to 640 nm and a full width at half maximum emission intensity of about 50 nm to about 60 nm. In some embodiments, the narrow-band red phosphor can comprise particles of at least one Group IIA/IIB selenide sulfide-based phosphor material, such as $CaSe_{1-x}S_x$:Eu (CSS phosphor). According to some embodiments, a light emitting device may comprise: a light-transmissive substrate; at least one blue LED chip mounted on the light-transmissive substrate, for example mounted on a face thereof; and a photoluminescence material at least partially covering the at least one blue LED chip, the photoluminescence material comprising narrow-band red phosphor particles that generate red light with a peak emission wavelength in a range of 600 nm to 640 nm and a Full Width at Half Maximum (FWHM) emission intensity of 50 nm to 60 nm. Suitable narrow-band red phosphor particles can include Group IIA/IIB selenide sulfide-based phosphor materials such as for example $CaSe_{1-x}S_x$:Eu (CSS phosphors).

The lamps according to some embodiments may comprise: a light-transmissive envelope; and at least one light emitting device located within the light-transmissive envelope, the light emitting device comprising: (1) a light-transmissive substrate; (2) at least one blue LED chip mounted on the light-transmissive substrate, for instance mounted on a face thereof; and (3) a photoluminescence material at least partially covering the at least one blue LED chip, the photoluminescence material comprising: (a) phosphor particles of a Group IIA/IIB selenide sulfide-based phosphor material that generates red light with a peak emission wavelength in a range of 600 nm to 640 nm and a full width at half maximum emission intensity of 50 nm to 60 nm; and (b) phosphor particles of a yellow to green-emitting phosphor that generates yellow to green light with a peak emission wavelength in a range of 520 nm to 570 nm; wherein the lamp is operable to generate light with a color temperature in a range of 1500 K to 4000 K or 1500 K to 6500 K and a CRI Ra greater than or equal to 90. The lamp may thus be able to produce light with a CRI Ra of 90 and have a performance, in particular luminous efficacy, that is comparable with that of a CRI Ra 80 lamp that uses a longer wavelength broad-band red phosphor such as CASN. The photoluminescence material can completely cover said at least one blue LED chip.

Some examples of the Group IIA/IIB selenide sulfide-based phosphor material of the present invention are described below, and for each example the material may be phosphor particles or coated phosphor particles. These phosphors are narrow-band red phosphors and have emission characteristics such as shown in FIG. 1, and described in more detail below.

Narrow-Band Red Phosphors—CSS Phosphors

It is postulated that it is the use of a narrow-band red phosphor having a certain emission characteristic that enables devices and lamps to be implemented that can achieve a CRI Ra of 90 and higher whilst having a performance, in particular luminous efficacy, that is comparable with the known CRI Ra devices and lamps that use a broad-band red phosphor such as CASN. Examples of suitable narrow-band red phosphors include Group IIA/IIB selenide sulfide-based phosphor materials. One example of a Group IIA/IIB selenide sulfide-based phosphor material has a composition $MSe_{1-x}S_x$:Eu, wherein M is at least one of Mg, Ca, Sr, Ba and Zn and $0<x<1.0$. A particular example of this phosphor material is CSS phosphor ($CaSe_{1-x}S_x$:Eu). Details of CSS phosphors are provided in co-pending U.S. patent application Ser. No. 15/282,551 filed 30 Sep. 2016, which is hereby incorporated by reference in its entirety. It is envisaged that the CSS narrow-band red phosphors described in U.S. patent application Ser. No. 15/282,551 can be used in the present invention. FIG. 1 shows normalized emission spectra of CSS phosphors for differing ratios of S/Se, the emission peak can be tuned from 600 nm to 650 nm by the ratio of S/Se in the composition and exhibits a narrow-band red emission spectrum with Full Width Half Maximum (FWHM) typically in the range from ~48 nm to ~60 nm (longer wavelength typically has a larger FWHM value). For comparison, a CASN red nitride phosphor (Calcium Aluminum Silicon Nitride based phosphor—general composition $CaAlSiN_3$:$Eu^{2+}$) typically has a FWHM of ~80 nm. As is known, CASN red phosphors are commonly used in LED applications. Note that x varies over a range from about 0.05 to about 0.8 for the compositions shown in FIG. 1—the higher peak wavelengths corresponding to the larger values for x; that is, as the amount of S increases this shifts the emission peak to a higher wavelength. Note that the notation CSS604 used herein represents the phosphor type (CSS) followed by the peak emission wavelength in nanometers (604). The same notation rule applies to the other phosphor types, such as CSS615 and CSS624 for example.

CSS phosphor particles are synthesized from purified $CaSeO_4$ and $CaSO_4$ in a mild $H_2$ (gas) environment (for example ~5% $H_2/N_2$). Herein, unless otherwise specified, CSS phosphor samples used in the examples have a composition of $CaSe_{1-x}S_x$:Eu with x ~0.2.

Narrow-Band Red Phosphors: Coated CSS Phosphors

The CSS phosphor particles can be coated with one or more oxides, for example: aluminum oxide ($Al_2O_3$), silicon oxide ($SiO_2$), titanium oxide ($TiO_2$), zinc oxide (ZnO), magnesium oxide (MgO), zirconium oxide ($ZrO_2$), boron oxide ($B_2O_3$) or chromium oxide (CrO). Alternatively, and/or in addition, the narrow-band red phosphor particles may be coated with one or more flourides, for example: calcium fluoride (CaF$_2$), magnesium fluoride (MgF$_2$), zinc fluoride (ZnF$_2$), aluminum fluoride (AlF$_3$) or titanium fluoride (TiF$_4$). In embodiments, the coatings may be a single layer, or multiple layers with combinations of the aforesaid coatings. The combination coatings may be coatings with an abrupt transition between the first and second materials, or may be coatings in which there is a gradual transition from the first material to the second material thus forming a zone with mixed composition that varies through the thickness of the coating.

Figure 2:
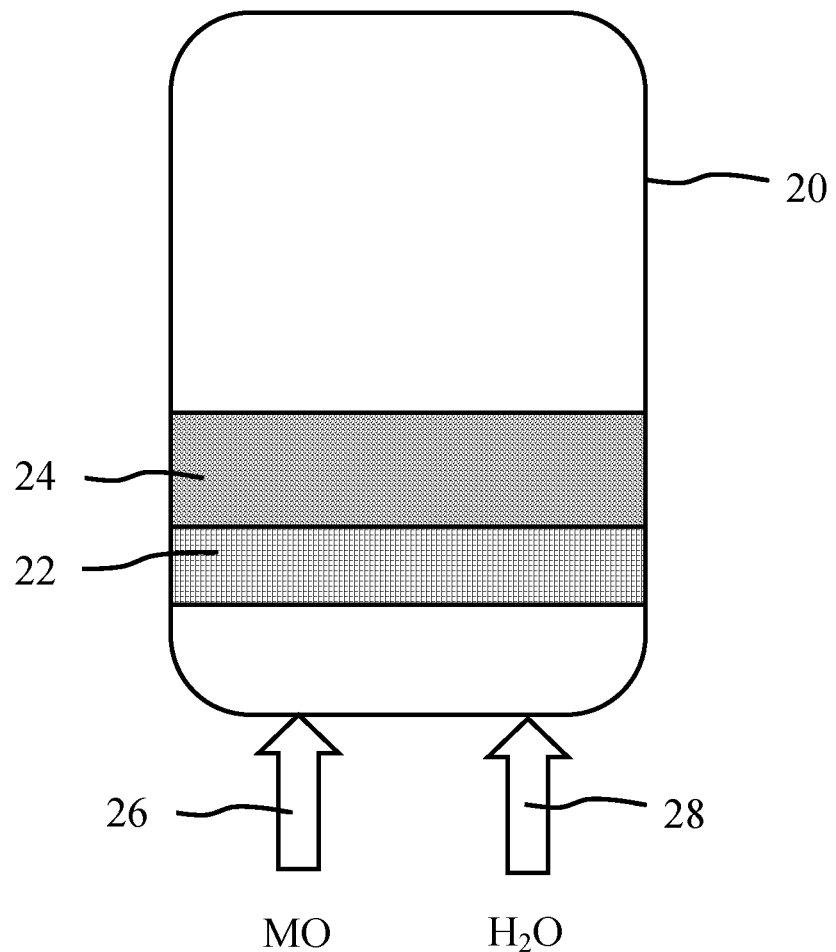
FIG. 2 is a schematic representation of a phosphor particle coating apparatus.

The particles can be coated by a CVD process in a fluidized bed reactor. FIG. 2 is a schematic representation of a phosphor particle coating apparatus. Reactor 20 comprises a porous support disc 22, over which phosphor powder 24 is held, and inlets 26 and 28 for metal organic precursor and water vapor, respectively. The thickness of the coating may typically be in the ranges 100 nm to 5 μm, 50 nm to 100 nm, 100 nm to 500 nm, 500 nm to 1 μm, or 1 μm to 2 μm. Coated CSS narrow-band red phosphor particle samples used in the examples herein are coated with approximately 1 μm of amorphous alumina (Al$_2$O$_3$).

In the case of alumina coatings, the coatings comprise a dense amorphous oxide coating layer on the CSS phosphor particle surface without pinholes (pinhole-free), that is a water impermeable coating.

In a typical coating process, the phosphor powder sample was loaded into the reactor and heated to 100-250° C., preferably 200° C., under N$_2$ gas flow. When an oxide coating is to be deposited, a metal organic oxide precursor MO such as TrimethylAluminum (TMA), Titanium tetrachloride (TiCl$_4$), Silicon tetra-chloride (SiCl$_4$), or DimethylZinc (DMZ) was introduced in to the reactor 20 through inlet 26 with a N$_2$ carrier gas through a bubbler. H$_2$O vapor was also introduced into the reactor 20 through inlet 28 to react with the metal oxide precursor to form oxide coating layers on phosphor particles. Complete fluidization of the particles being coated (from gas flow optimization, etc.) without any dead space is important to ensure homogeneous coating of all phosphor particles. In a typical coating conducted at 200° C., for a 250 g phosphor particle loading of the reactor, the coating was produced with a metal oxide precursor feeding rate of 1 to 10 g/hour for 4 hours, while feeding H$_2$O at a rate of 2 to 7 g/hour. These conditions can produce dense and pinhole free coatings and these conditions are able to produce dense substantially pin-hole free coatings of uniform thickness, with a theorized percentage solid space (percentage bulk density) of greater than 95% and in embodiments greater than 97% and in embodiments greater than 99%. In this patent specification, percentage solid space=(bulk density of the coating/density of the material within a single particle)×100. It will be understood that the percentage solid space (% solid space) provides a measure of the porosity of the coating resulting from pinholes.

A variation of the phosphor particle coating apparatus of FIG. 2 for depositing a fluoride coating comprises introducing a metal organic fluoride MF precursor in to the reactor 20 through inlet 26 with a N$_2$ carrier gas through a bubbler. When depositing a fluoride coating no H$_2$O is introduced into the reactor. In other respects, coating with a fluoride is analogous to coating with an oxide as described above.

Narrow-Band Red Phosphors: Doped-CSS Phosphors

A second example of a Group IIA/IIB selenide sulfide-based phosphor material has a composition MS$_x$Se$_y$A$_z$:Eu, wherein M is at least one of Mg, Ca, Sr and Ba, A comprises one or more of carbon, nitrogen, boron, phosphorous and a monovalent combining group NCN (cyanamide), 0<z≤0.05, and 0.8<x+y<1.25. A particular example of this phosphor material is a doped-CSS phosphor (CaS$_x$Se$_y$A$_z$:Eu). Details of these doped-CSS phosphors are provided in co-pending U.S. patent application Ser. No. 15/075,080 filed 18 Mar. 2016 which is hereby incorporated by reference in its entirety. It is envisaged that the doped-CSS phosphors described in co-pending U.S. patent application Ser. No. 15/075,080 can be used in the present invention. More generally, a narrow-band red phosphor can have a general composition MS$_x$Se$_y$A$_z$:Eu, wherein M is at least one of Mg, Ca, Sr and Ba, A is at least one of C, N, B, P, and the monovalent combining group NCN (cyanamide), and can further include one or more of O, F, Cl, Br and I. It can be that (1) 0.8<x+y<1.25 (where x≥0 and y≥0.1) and 0<z≤0.05, and it can be that (2) x+y is not equal to 1, x≥0, y≥0.1 and 0<z≤0.05, and it can be that (3) 1.0<x+y<1.25 (where x≥0 and y≥0.1) and 0<z≤0.05, and it can be that (4) x, y and z are determined strictly by charge balancing. The narrow-band red phosphor can have a particle size distribution defined by $_{50}$ in the range of 3 to 45 μm (microns), end points included, and it can be that D$_{50}$ in the range of 5 to 25 μm (microns), end points included. It is expected that the element A may be found in the phosphor material in one or more of the following positions: an interstitial position, a substitutional position, on a grain boundary or crystal surface, or within a second phase (such as within calcium fluoride). Although the doped-CSS phosphors can comprise phosphor compounds in which M is one or more alkaline earth metals, some amount of other metals such as zinc, lithium or cadmium can substitute for some of the alkaline earth metal.

Synthesis of Doped-CSS Phosphors (MS$_x$Se$_y$A$_z$:Eu)

EXAMPLE 1

Synthesis of 120 g of CaSeO$_4$ with 0.3 wt. % Eu$_2$O$_3$

After dissolving 83.4 g SeO$_2$ in 300 ml of de-ionized water in a beaker, 45.0 g of 30% H$_2$O$_2$ solution is slowly added, then stirred for about 1 hour. Ammonium hydroxide (29 wt. %) is then slowly added to the solution until the pH reached approximately 10—this is solution #1.

110.0 g of CaCl$_2$.2H$_2$O is dissolved in 450 ml of ethanol in another beaker, then 0.40 g of Eu$_2$O$_3$ powder is added, followed by 36% HCl which is slowly added until the solution became clear—this is solution #2.

The solution of (NH$_4$)$_2$SeO$_4$ (solution #1) is added dropwise to solution #2 precipitating white crystals; the solution with precipitates is stirred for about 2 hours, then the solution is filtered and the precipitates are dried at 80° C.

EXAMPLE 2

Synthesis of Doped-CSS Phosphors (CaS$_{0.25-z}$Se$_{0.75}$C$_z$Eu$_{0.003}$)

30 g of white CaSeO$_4$ with 0.3 wt. % Eu powder is mixed with 1.2 g of sulfur powder and 1.2 g powdered carbon (such as Alfa Aesar: carbon black, 99.9+%). The mixture is put in an alumina crucible with an alumina cover and fired at 600° C. for 2 hours under 5% hydrogen balanced with nitrogen, then the temperature is increased to 900° C. for 4 hours.

Furthermore, amounts of LiF, NH$_4$Cl, CaCl$_2$ or NH$_4$Br can also be added as a flux. It can be that 0.9 g of boric acid is used in place of the powdered carbon to make MS$_x$Se$_y$B$_z$:Eu phosphors. Similarly, calcium nitride, phosphorus pentasulfide and calcium cyanamide can be used in place of carbon as sources of N, P and NCN in the phosphor material.

EXAMPLE 3

Washing As-Synthesized Doped-CSS Phosphors
(CaS$_{0.25-z}$Se$_{0.75}$C$_z$Eu$_{0.003}$)

The above as-synthesized phosphors are ground in a ceramic mortar, then placed in 600 ml of methanol solution in a 1.0 liter beaker and stirred for 1 hour, then the phosphor particles are allowed to settle, the solvents are decanted off the phosphor particles, and the particles are dried.

As with CSS phosphors, the doped-CSS phosphor can be coated in the same manner and with the same materials detailed above.

LED-Filament Lamps: A-Series (A19) Lamps

Figure 3A:
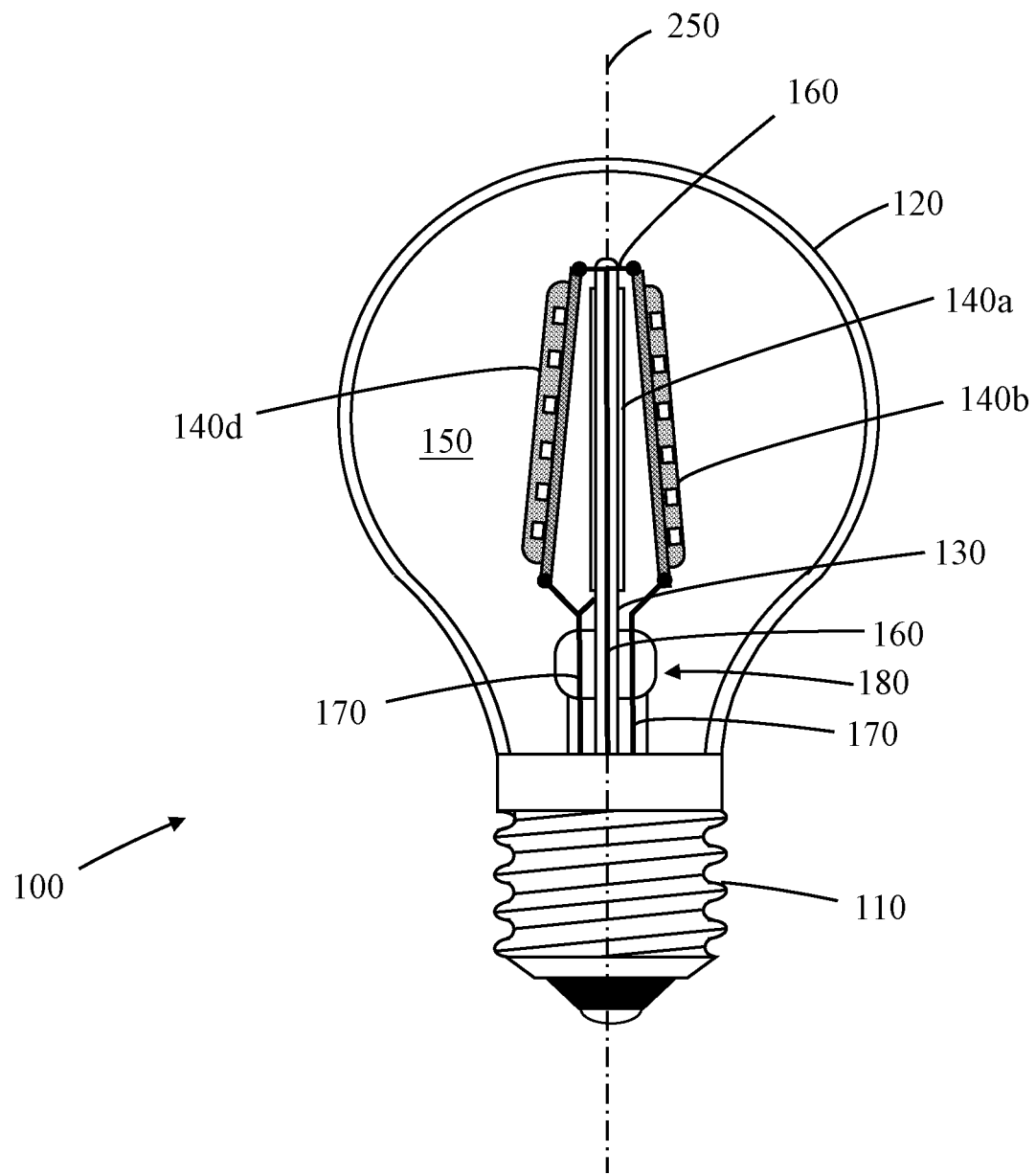
FIGS. 3A and 3B respectively illustrate partial cross-sectional A-A side and plan views of a four LED-filament A-Series (A19) lamp in accordance with an embodiment of the invention.
Figure 3B:
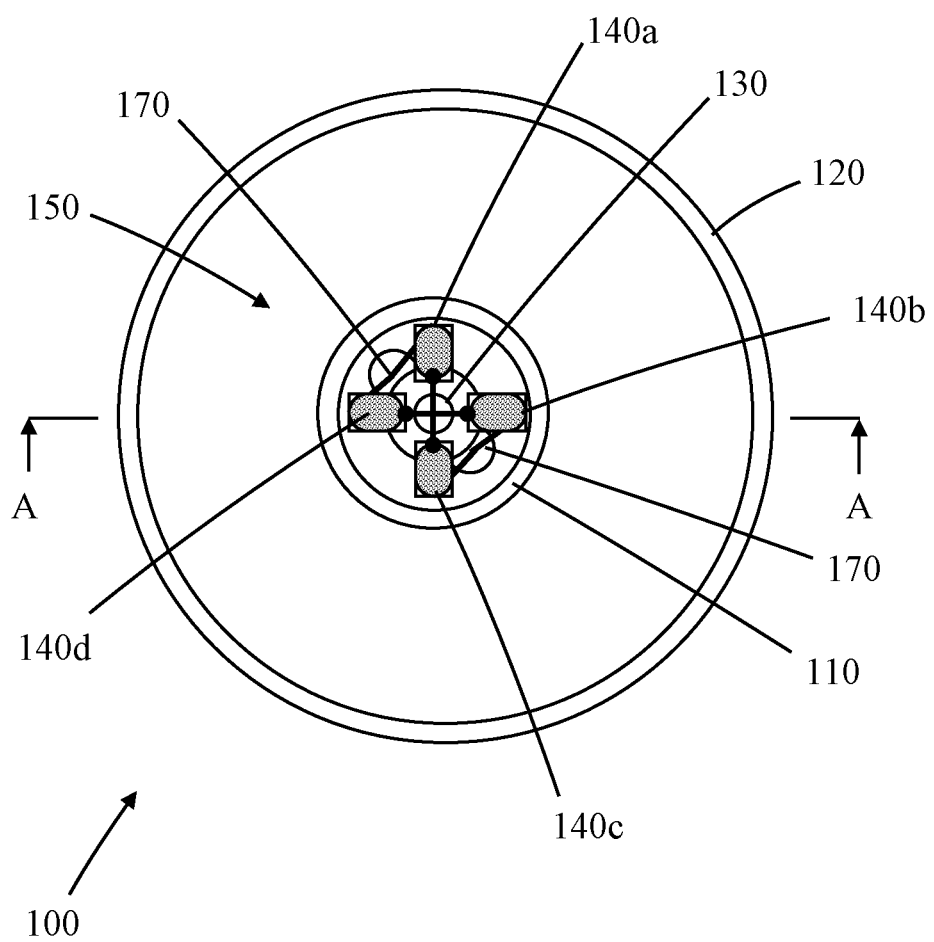

FIG. 3A and 3B respectively illustrate a partial cross-sectional side view through A-A and a partial cutaway plan view of an LED-filament A-Series lamp (bulb) 100 in accordance with an embodiment of the invention. The LED-filament lamp 100 is intended to be an energy efficient replacement for an incandescent A19 light bulb and is configured to generate 550 lm of light with a CCT (Correlated Color Temperature) of 2700 K and a CRI Ra of 90 and CRI R9>50. The LED-filament lamp is nominally rated at 4 W. As is known, an A-series lamp is the most common lamp type and an A19 lamp is 2⅜ inches (¹⁹⁄₈) wide at its widest point and approximately 4⅜ inches in length.

The LED-filament lamp 100 comprises a connector base 110, a light-transmissive glass envelope 120; a glass LED-filament support (stem) 130 and four LED-filaments 140a, 140b, 140c, 140d.

In some embodiments, the LED-filament lamp 100 can be configured for operation with a 110V (r.m.s.) AC (60 Hz) mains power supply as used in North America. As illustrated, the LED-filament lamp 100 can comprise an E26 (φ26mm) connector base (Edison screw lamp base) 110 enabling the lamp to be directly connected to a mains power supply using a standard electrical lighting screw socket. It will be appreciated that depending on the intended application other connector bases can be used such as, for example, a double contact bayonet connector (i.e. B22d or BC) as is commonly used in the United Kingdom, Ireland, Australia, New Zealand and various parts of the British Commonwealth or an E27 (φ27 mm) screw base (Edison screw lamp base) as used in Europe. The connector base 110 can house rectifier or other driver circuitry (not shown) for operating the LED-filament lamp.

The light-transmissive glass envelope 120 is attached to the connector 110 and defines a hermetically sealed volume 150 in which the LED-filaments 140a to 140d are located. The envelope 120 can additionally incorporate or have a layer of a light diffusive (scattering) material such as for example particles of Zinc Oxide (ZnO), titanium dioxide (TiO$_2$), barium sulfate (BaSO$_4$), magnesium oxide (MgO), silicon dioxide (SiO$_2$) or aluminum oxide (Al$_2$O$_3$).

The LED-filaments 140a to 140d, which are linear (elongate) in form, are oriented such that each runs in a direction that is generally parallel to an axis 250 of the lamp 100. The LED-filaments 140a to 140b can be equally circumferentially spaced around the glass filament support (stem) 130 (FIG. 3B). A first end of each LED-filament 140a to 140d distal to the connector base 110 is electrically and mechanically connected to a first conducting wire 160 that passes down an axis of the LED filament support 130 to the connector base 110. A second end of each LED-filament 140a to 140d proximal to the connector base 110 is electrically and mechanically connected to a second conducting wire 170 that passes through a base portion 180 of the LED filament support 130 to the connector base 110.

An LED-filament 140 according to an embodiment of the invention is now described with reference to FIGS. 4A and 4B which shows a cross-sectional side view through A-A and a partial cut-away side view of an LED-filament. The LED filament 140 comprises a light-transmissive substrate (circuit board) 200 having an array of blue emitting (dominant wavelength typically ~450 to ~460 nm) unpackaged LED chips (dies) 210 mounted directly to one face. In the embodiment, illustrated the circuit board 200 is planar and has an elongate form (strip) with the LED chips 210 being configured as a linear array along the length of the substrate. An elongate array may be preferred when the LED-filament 200 is used as a part of an energy efficient bulb since the appearance and emission characteristics of the device more closely resembles a traditional filament of an incandescent bulb. Depending on the application the circuit board can comprise other forms such as for example being square or circular and the LED chips configured as other arrays or configurations. It should be noted that the LED chips 210 are mounted directly to the circuit board 200 and are not packaged. Such packaging would otherwise block the emission of light in a backward direction towards and through the circuit board 200. Furthermore, it should be noted that the light-transmissive substrate may have a transmittance in a range of 20% to 100% in the visible light spectrum.

Typically, each LED-filament comprises fifteen LED 65 mW chips with a total nominal power of about 1 W.

The circuit board 200 can comprise any light-transmissive material which is at least translucent and preferably has a transmittance to visible light of 50% or greater. Accordingly, the circuit board can comprise a glass or a plastics material such as polypropylene, silicone or an acrylic. To aid in the dissipation of heat generated by the LED chips 210, the circuit board 200 is not only light-transmissive but is advantageously also thermally conductive. Examples of suitable light-transmissive thermally conductive materials include: magnesium oxide, sapphire, aluminum oxide, quartz glass, aluminum nitride and diamond. The transmittance of the thermally conductive circuit board can be increased by making the circuit board thin. To increase mechanical strength, the circuit board can comprise a laminated structure with the thermally conductive layer mounted on a light-transmissive support such as a glass or plastics material. To further assist in the dissipation of heat the volume within the glass envelope is preferably filled with a thermally conductive gas such as helium, hydrogen or a mixture thereof.

The circuit board 200 can further comprise electrically conductive tracks 220 configured in a desired circuit configuration for electrically connecting the LED chips 210. As illustrated the LED chips 210 of the LED filament can be connected serially as a string and the LED filaments 140a to 140b connected in parallel. It will be appreciated that other circuit configurations can be used. The electrically conductive tracks 220 can comprise copper, silver or other metal or a transparent electrical conductor such as indium tin oxide (ITO). As illustrated the LED chips 210 are electrically connected to the conducting tracks 220 using bond wires 230. In other embodiments, the LED chips can be electrically connected together using bond wires directly between the LED chips thereby eliminating the need for conducting tracks so as to enable the LEDs chips to be located more closely to one another. In other embodiments, the LED chip can comprise surface mountable or flip-chip devices. The LED chips 210 can be mounted to the circuit board by soldering, a thermally conductive adhesive or by other fixing methods which will be apparent to those skilled in the art. Where the light-transmissive circuit board 200 comprises a thermally conductive material the LED chips 210 are advantageously mounted in thermal communication with the circuit board. A heat sink compound such as beryllium oxide can be used to aid in thermal coupling of the LED chips to the circuit board.

The LED-filament 140 further comprises a photoluminescence wavelength conversion material 240 comprising a mixture of, for example a yellow to green emitting (peak emission wavelength 520 nm to 570 nm) and a narrow-band red emitting (600 nm to 640 nm, FWHM 50 nm to 60 nm) phosphor materials directly to the LEDs chips 210 in the form of an encapsulating layer.

In operation, blue excitation light generated by the LED chips 210 excites the yellow to green-emitting and narrow-band red-emitting phosphors to generate yellow to green and red photoluminescence light. The emission product of the LED-filament which appears white in color comprises the combined photoluminescence light and unconverted blue LED light. Since the photoluminescence light generation process is isotropic, phosphor light is generated equally in all directions and light emitted in a direction towards the circuit board can pass through the circuit board and be emitted from the rear of the device. It will be appreciated that the use of a light-transmissive circuit board (substrate) enables the device to achieve a generally omnidirectional emission characteristic. Additionally, particles of a light reflective material can be combined with the phosphor material to reduce the quantity of phosphor required to generate a given emission product color. Furthermore, it is understood that the color of the light emitted by the bulb can be changed by combining a different phosphor, or no other phosphor with the narrow-band red phosphor.

LED-Filament Lamps: B-Series (B11) Bullet Lamp

Figure 5A:
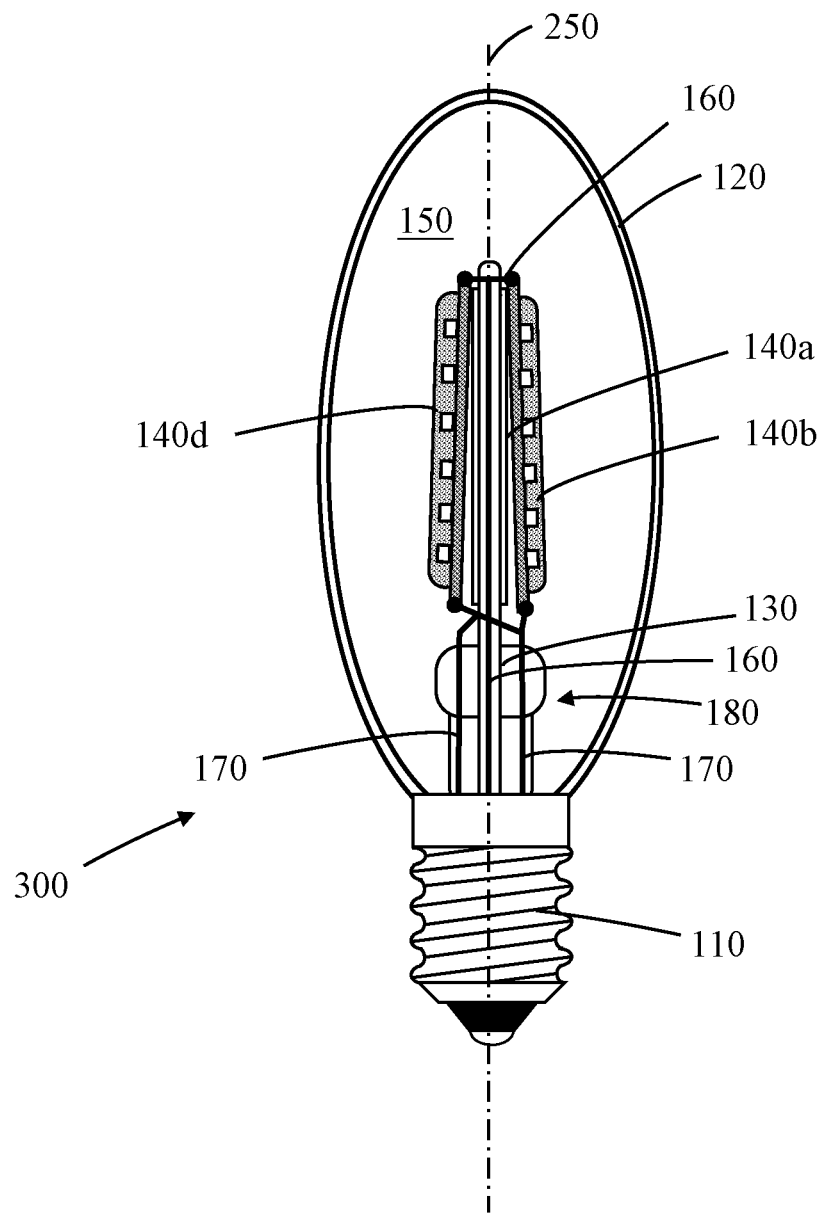
FIGS. 5A and 5B respectively illustrate partial cross-sectional C-C side and plan views of a four LED-filament B-Series (Bullet B11) lamp in accordance with an embodiment of the invention.
Figure 5B:
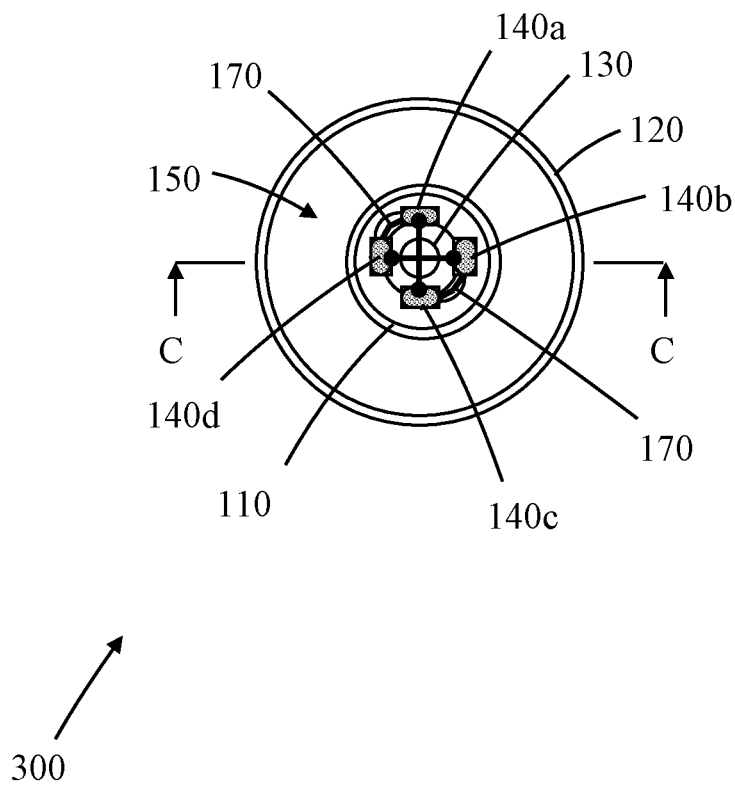

FIG. 5A and 5B respectively illustrate a partial cross-sectional side view through C-C and a partial cutaway plan view of an LED-filament B-Series bullet lamp (candle bulb) 300 in accordance with an embodiment of the invention. The LED-filament lamp 300 is intended to be an energy efficient replacement for an incandescent B11 bullet light bulb and is configured to generate 450 lm of light with a CCT (Correlated Color Temperature) of 2700 K and a CRI Ra of 90 and CRI R9>50. The LED-filament lamp 300 has an efficacy comparable to that of a packaged LED. The CRI Ra of at least 90 is attainable without requiring the use of an orange or red emitting phosphor. As is known, the B11 bullet lamp is 1⅜ inches (¹¹⁄₈) wide at its widest point. The LED-filament lamp 300 comprises four 1 W LED-filaments and is nominally rated at 4 W. The LED-filament lamp 300 is essentially the same as the A19 LED-filament lamp 100 described in relation to FIGS. 3A, 3B, 4A and 4B and like reference numerals are used to denote like parts.

Figure 6:
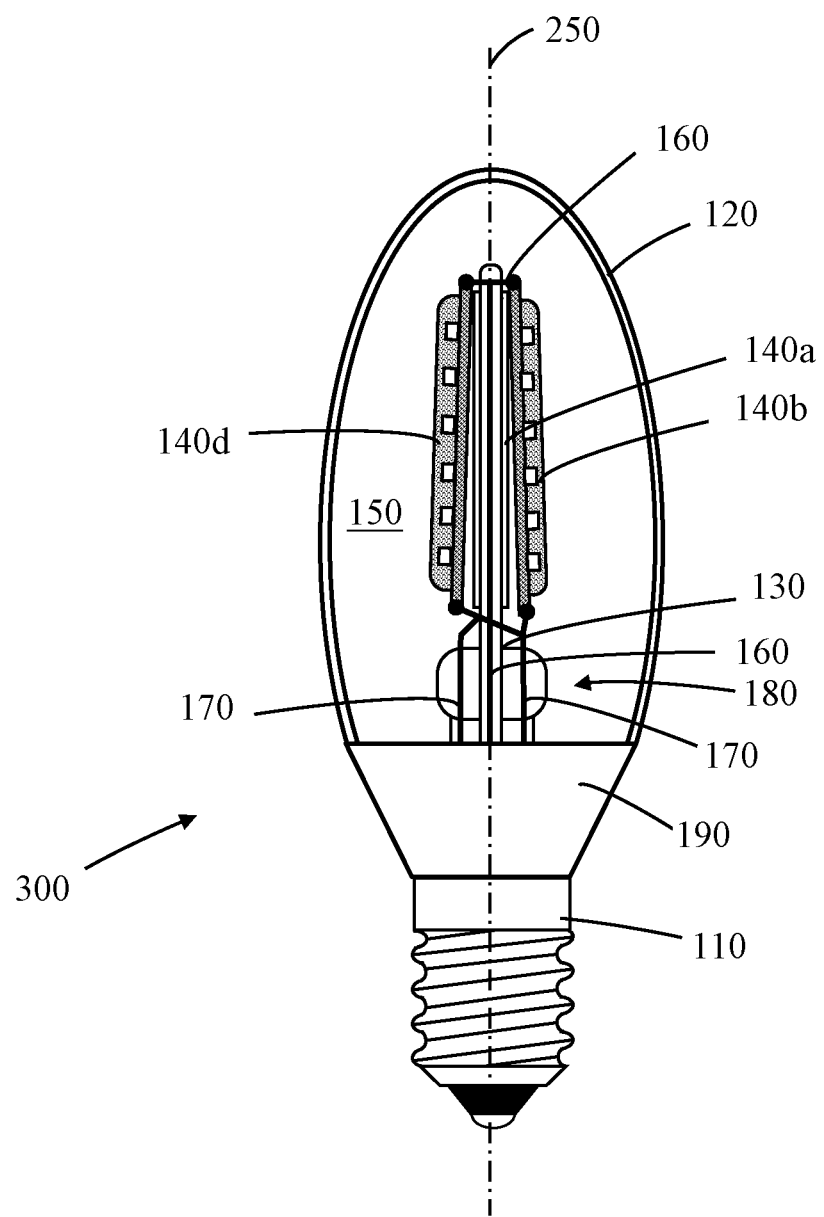
FIG. 6 illustrates a partial cross-sectional side view of a four LED-filament B-Series (B11) lamp in accordance with an embodiment of the invention.

As illustrated, the LED-filament lamp 300 can comprise an E12 ($\phi_{12}$ mm) connector base (Edison screw lamp base) 110. If practicable, the connector base 110 can house driver circuitry (not shown) for operating the LED-filaments. Where it is impracticable to house the driver circuitry in the connector base 110 the LED-filament lamp 300 can further comprise an extender 190 disposed between the envelope 120 and connector base 110, as shown in FIG. 6. The extender 190 can comprise a hollow frusto-conical element comprising a plastics material.

Light emitting devices of the present invention have been described herein as LED-filaments including a light-transmissive substrate which is elongate in form, also as devices with an array of blue LED chips mounted on the light-transmissive substrate, and also as devices with LED chips mounted on only one side of the substrate. However, in other embodiments the light-transmissive substrate may be circular, square, or one of many other shapes, the device may have only a single LED chip, or just two LED chips, mounted on a light-transmissive substrate, and LED chips may be mounted on both sides of a light-transmissive substrate.

LED-Filament Lamp Test Data: A19 Lamp

FIGS. 7-11 show measured test data versus time after lamp turn-on for a four LED-filament A19 lamp in accordance with an embodiment of the invention having an LED-filament comprising a green aluminate phosphor (GAL535)+a narrow-band red phosphor (CSS626). Note that the notation GAL535 used herein represents the phosphor type (GAL)—phosphors of general composition $Lu_3Al_5O_{12}$:Ce (i.e. LuAG-based)—followed by the peak emission wavelength in nanometers (535). Each figure also shows comparative data for a four LED-filament A19 lamp with an LED-filament comprising GAL535+a red phosphor (CASN630). As described above, CASN red nitride phosphor (Calcium Aluminum Silicon Nitride—general composition $CaAlSiN_3$:$Eu^{2+}$) is the most commonly used red-emitting phosphors in LED applications due to its high reliability and brightness.

Tables 1 and 2 tabulate measured test data for four LED-filament A19 lamp with LED-filaments comprising i) GAL535+CSS626 and ii) GAL535+CASN630. Table 1 comprises test data that is measured 15 seconds after lamp turn-on.

TABLE 1

Measured test data for a nominal 550 lm, 2700K, 90 CRI Ra, Four
LED-filament A19 Lamp Data measured 15 seconds after lamp Turn-On

| LED-filament composition | Power (W) | Flux (lm) | Efficacy (lm/W) | CIE x | CIE y | CCT (K) | CRI Ra | CRI R9 |
|---|---|---|---|---|---|---|---|---|
| GAL535 + CSS626 | 3.98 | 576.4 | 144.8 | 0.4722 | 0.4212 | 2615 | 89.5 | 25.9 |
| GAL535 + CASN630 | 4.04 | 592.3 | 146.5 | 0.4708 | 0.4282 | 2685 | 82.4 | 6.8 |

Table 2 comprises test data that is measured 15 minutes after lamp turn-on (i.e. once the light emission of the lamp has stabilized).

TABLE 2

Measured test data for a nominal 550 lm, 2700K, 90 CRI Ra, Four LED-filament A19 Lamp Data measured 15 minutes after lamp Turn-On

| LED-filament composition | Power (W) | Flux (lm) | Efficacy (lm/W) | CIE x | CIE y | CCT (K) | CRI Ra | R9 |
|---|---|---|---|---|---|---|---|---|
| GAL535 + CSS626 | 3.91 | 538.7 | 137.8 | 0.4644 | 0.4212 | 2919 | 87.9 | 19.4 |
| GAL535 + CASN630 | 3.97 | 554.6 | 139.8 | 0.4674 | 0.4259 | 2713 | 81.8 | 4.8 |

Compared with an LED-filament comprising a CASN phosphor it can be seen (Table 2) that an LED-filament and/or LED-filament lamp in accordance with the invention comprising a narrow-band (CSS) phosphor can generate light with a CRI Ra of about 90 (~88). Moreover, an LED-filament in accordance with the invention can substantially increase CRI R9 by about fifteen to about nineteen compared with an LED-filament comprising a longer wavelength CASN phosphor in which CRI R9 is about five (~4.8). As indicated in Table 2, use of a CSS phosphor can result in a small decrease in luminous flux (~3%: 554.6 lm→538.7 lm) and a small decrease of luminous efficacy (~1%: 139.8→137.8). However, these small decreases are far outweighed by the significant increase in CRI Ra and CRI R9 and such small decreases in brightness/efficacy are acceptable in LED-filament lamps where light quality may matter more than overall light output. Test data further show that LED-filaments using CSS phosphor can generate light with a CRI R8 in a range about 70 to about 80, that is greater than or equal to about 72. In summary, it will be appreciated that LED-filaments in accordance with the invention comprising a CSS phosphor can produce light with a CRI Ra of about 90 and have a luminous efficacy that is substantially the same as that of known CRI Ra 80 LED-filaments which comprise a longer wavelength CASN phosphor.

Figure 7:
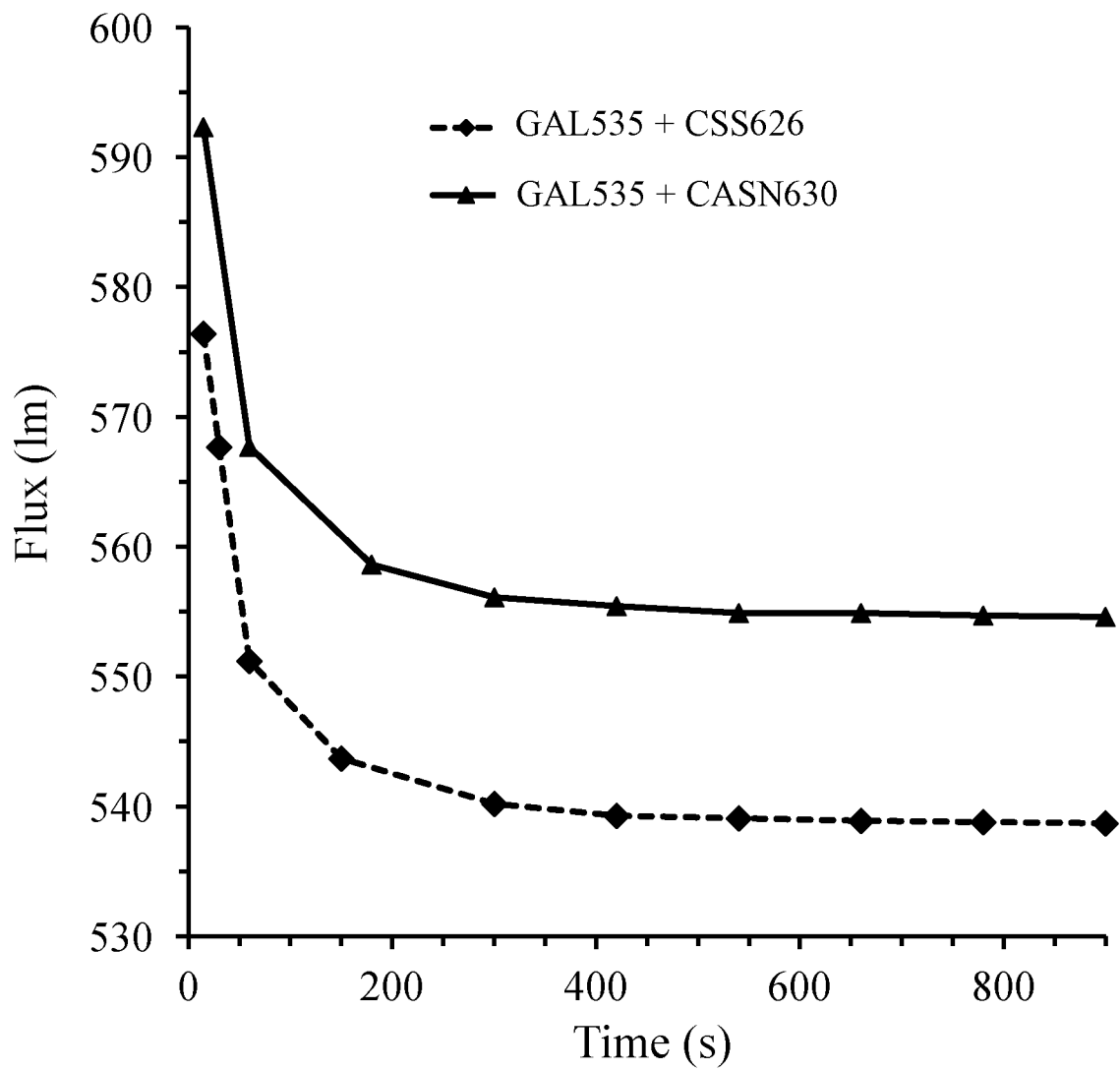
FIG. 7 shows test data, luminous flux (lm) versus time (s) after lamp turn-on, for a four LED-filament A19 lamp with LED-filaments comprising i) green aluminate phosphor (GAL535)+narrow-band red phosphor (CSS626) and ii) green aluminate phosphor (GAL 535)+red nitride phosphor (CASN630)

FIG. 7 shows measured luminous flux (lm) versus time (s) after lamp turn-on, for a four LED-filament A19 lamp with LED-filaments comprising i) GAL535+CSS626 and ii) GAL535+CASN630. As can be seen in FIG. 7, the luminous flux (Brightness) for LED-filament lamps comprising CSS phosphor or CASN phosphor each reach a stable value after a stabilization period of about 400 s from lamp turn-on and show about a 6% decrease in luminous flux during the stabilization period. After stabilizing, the luminous flux for i) an LED-filament comprising CASN phosphor is approximately only 3% greater than ii) an LED-filament comprising CSS phosphor, which it will be appreciated is a minimal difference.

Figure 8:
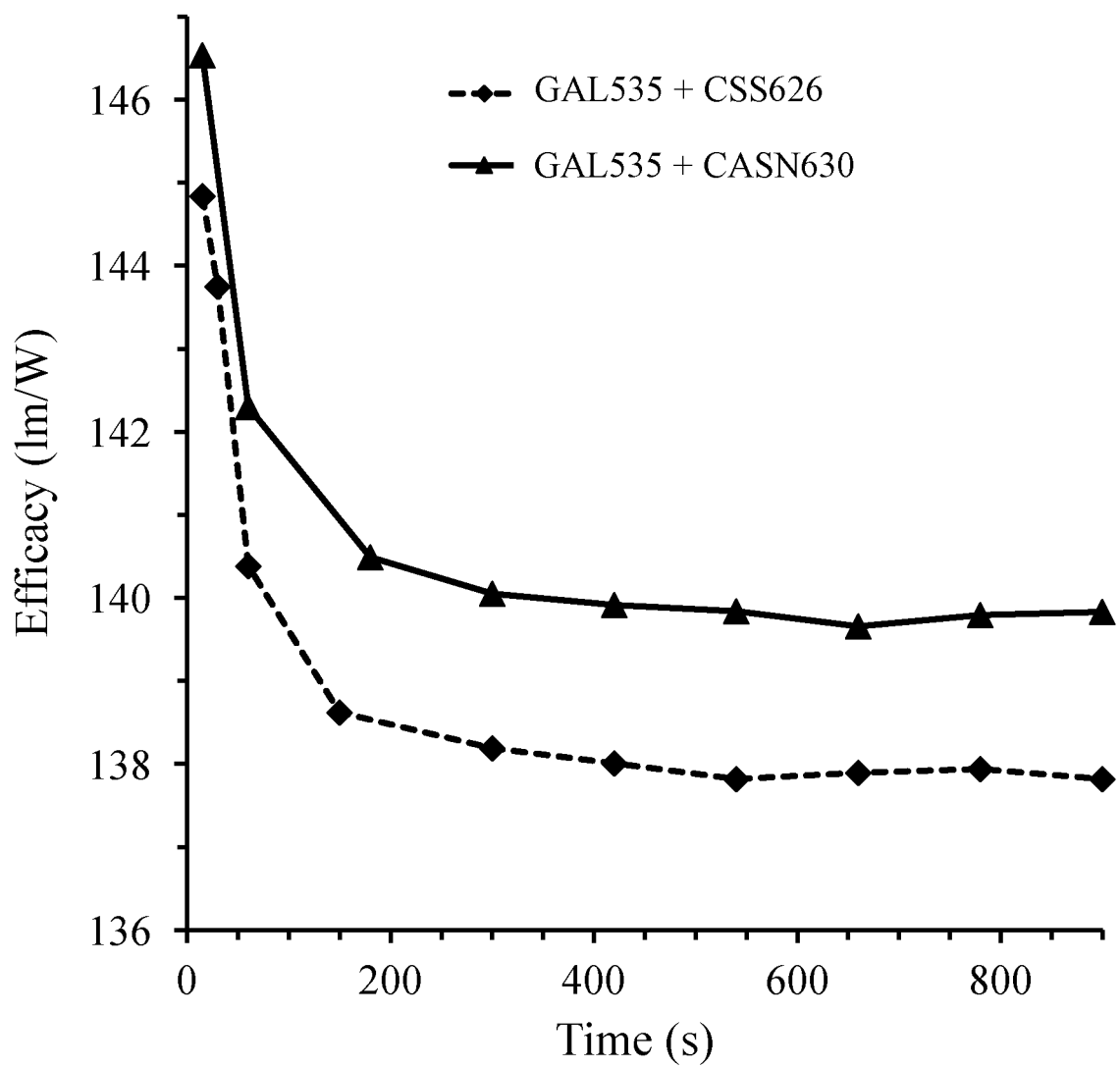
FIG. 8 shows test data, luminous efficacy (lm/W) versus time (s) after lamp turn-on, for a four LED-filament A19 lamp with LED-filaments comprising i) green aluminate phosphor (GAL535)+narrow-band red phosphor (CSS626) and ii) green aluminate phosphor (GAL535)+red nitride phosphor (CASN630)

FIG. 8 shows measured luminous efficacy (lm/W) versus time (s) after lamp turn-on, for a four LED-filament A19 lamp with LED-filaments comprising i) GAL535+CSS626 and ii) GAL535+CASN630. As can be seen in FIG. 8, the luminous efficacy for LED-filament lamps comprising CSS phosphor or CASN phosphor each reach a stable value after a stabilization period of about 400 s and show about a 6% decrease in luminous efficacy over the stabilization period. After stabilizing, the luminous efficacy for i) an LED-filament comprising CASN phosphor is approximately only 1.4% greater than ii) an LED-filament comprising CSS phosphor, which it will be appreciated is a minimal difference.

Figure 9:
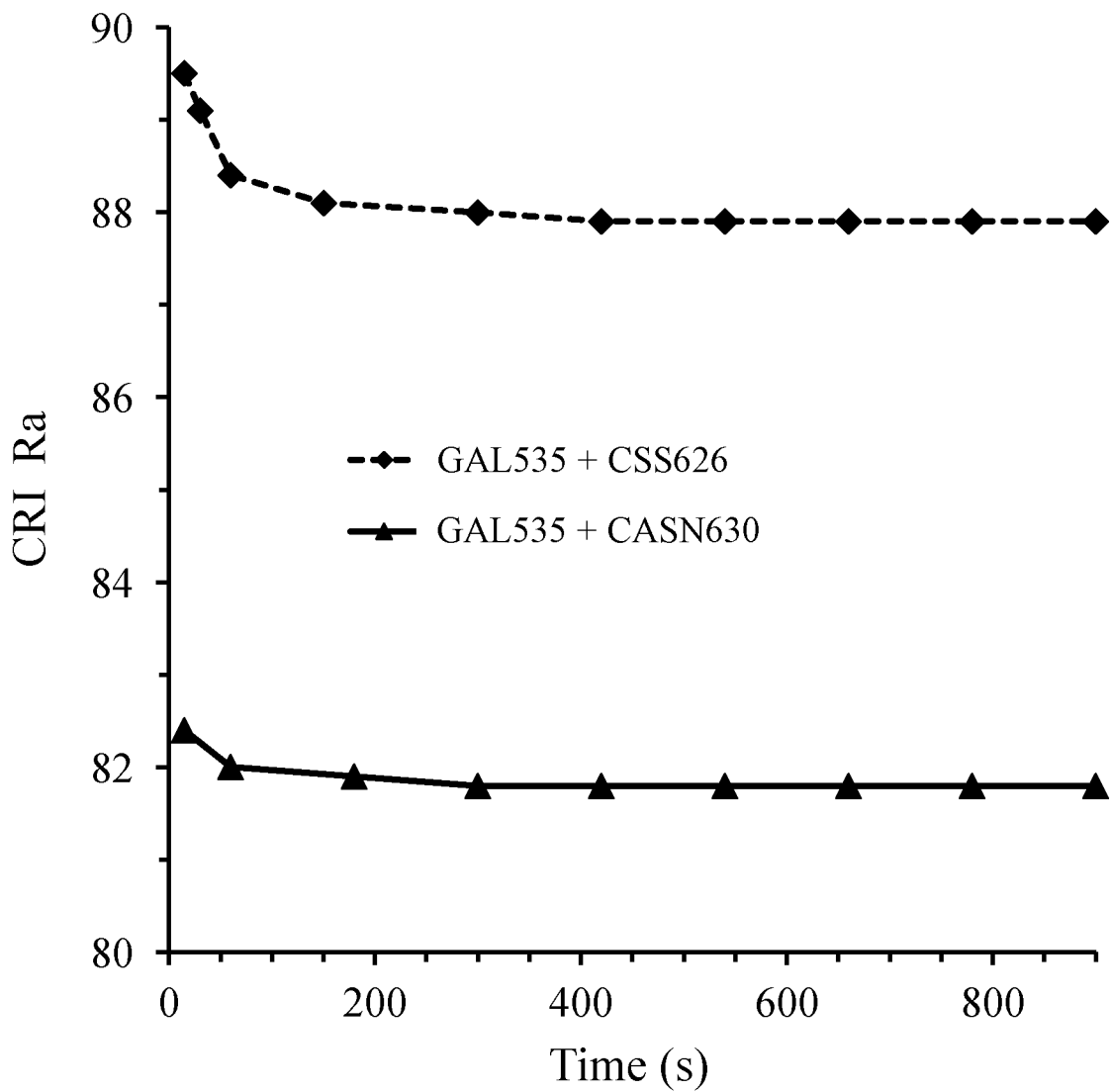
FIG. 9 shows test data, Color Rendering Index (CRI) Ra versus time (s) after lamp turn-on, for a four LED-filament A19 lamp with LED-filaments comprising i) green aluminate phosphor (GAL535)+narrow-band red phosphor (CSS626) and ii) green aluminate phosphor (GAL535)+red nitride phosphor (CASN630)

FIG. 9 shows measured general Color Rendering Index (CRI Ra) versus time (s) after lamp turn-on, for a four LED-filament A19 lamp with LED-filaments comprising i) GAL535+CSS626 and ii) GAL535+CASN630. As can be seen in FIG. 9, the general CRI Ra for i) an LED-filament lamp comprising CSS phosphor reaches a stable value after about 300 s, compared with ii) an LED-filament lamp comprising CASN phosphor that reaches a stable value after about 400 s. The general CRI Ra for i) an LED-filament lamp comprising CSS phosphor decreases about 1.5% (89.5→88) during the stabilization period, while ii) an LED-filament lamp comprising CASN phosphor decreases about 0.5% (82.5→82) during the stabilization period. It should be noted that after stabilizing i) an LED-filament comprising CSS phosphor CRI Ra is close to 90 (~88) and is significantly greater than ii) an LED-filament comprising CASN phosphor in which CRI Ra is close to 80 (~82).

Figure 10:
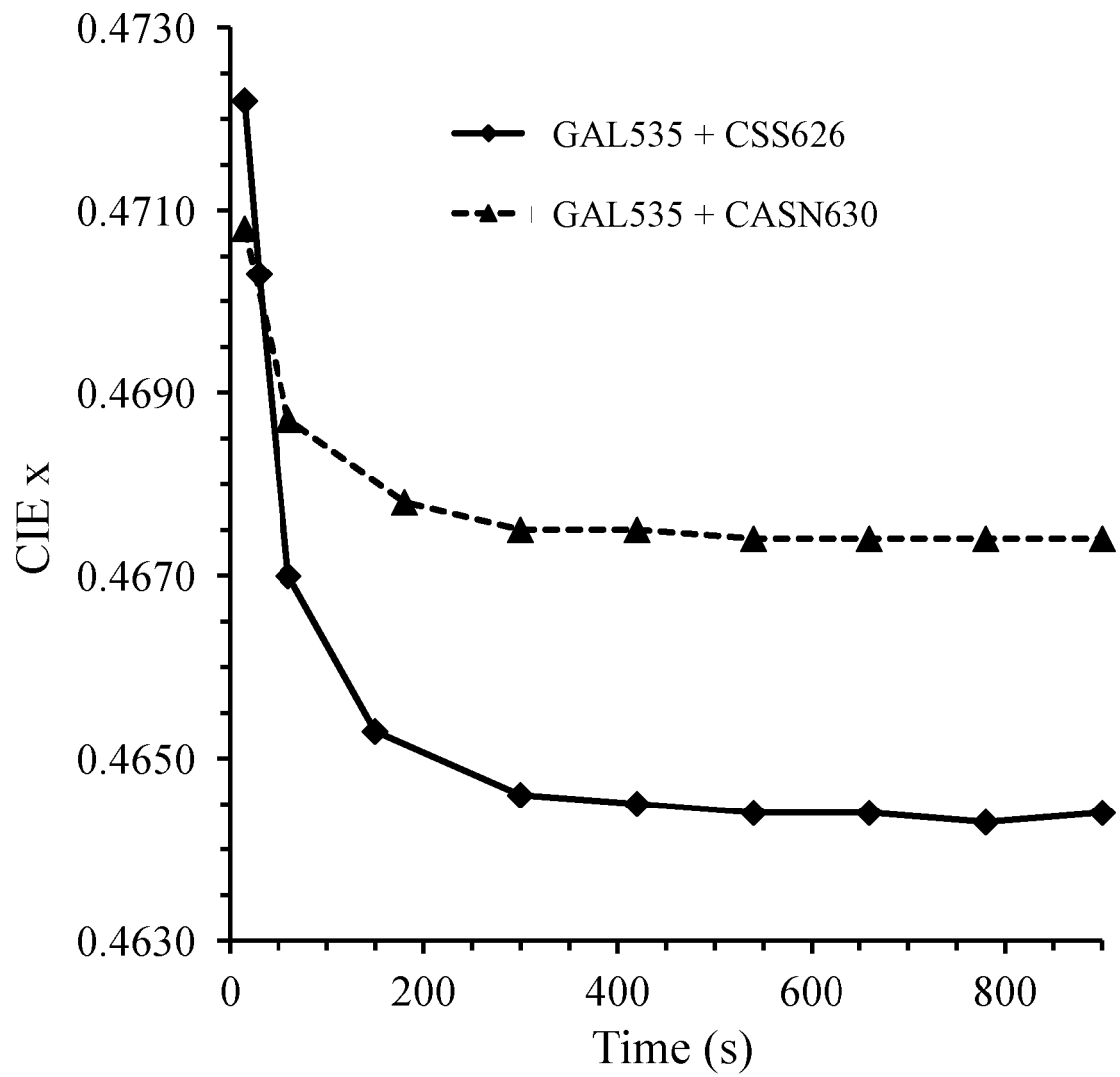
FIG. 10 shows test data, chromaticity CIE x versus time (s) after lamp turn-on, for a four LED-filament A19 lamp with LED-filaments comprising i) green aluminate phosphor (GAL535)+narrow-band red phosphor (CSS626) and ii) green aluminate phosphor (GAL535)+red nitride phosphor (CASN630)

FIG. 10 shows measured chromaticity CIE x versus time (s) after lamp turn-on, for a four LED-filament A19 lamp with LED-filaments comprising i) GAL535+CSS626 and ii) GAL535+CASN630. As can be seen in FIG. 10, the chromaticity CIE x for LED-filament lamps comprising CSS phosphor or CASN phosphor each reach a stable value after a stabilization period of about 400 s. The chromaticity CIE x for an LED-filament lamp comprising CSS phosphor decreases ($\Delta$ CIE x) about 0.0035 (0.4710→0.4675) during the stabilization period, compared with an LED-filament lamp comprising CASN phosphor in which CIE x decreases ($\Delta$CIE x) about 0.0077 (0.4722→0.4645) during the stabilization period.

Figure 11:
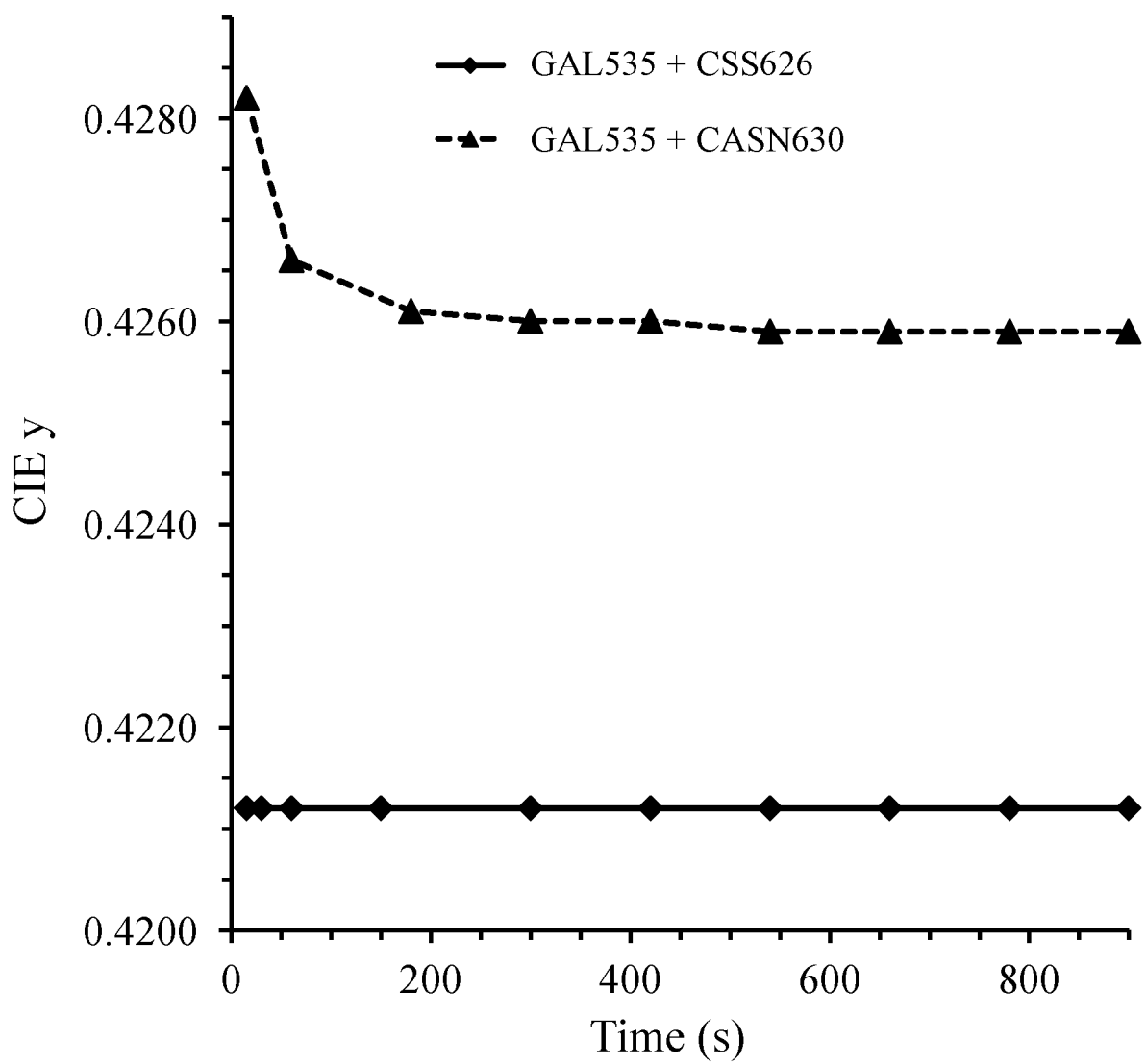
FIG. 11 shows test data, chromaticity CIE y versus time (s) after lamp turn-on, for a four LED-filament A19 lamp with LED-filaments comprising i) green aluminate phosphor (GAL535)+narrow-band red phosphor (CSS626) and ii) green aluminate phosphor (GAL535)+red nitride phosphor (CASN630)

FIG. 11 shows measured chromaticity CIE y versus time (s) after lamp turn-on, for a four LED-filament A19 lamp with LED-filaments comprising i) GAL535+CSS626 and ii) green aluminate phosphor GAL535+CASN630. As can be seen in FIG. 11, the chromaticity CIE y for an LED-filament lamp comprising CSS phosphor is stable from initial turn-on of the lamp and CIE y shows no measurable change over a period of 900 s from turn-on. In contrast, the chromaticity CIE y for an LED-filament lamp comprising CASN phosphor only reaches a stable value after a stabilization period of about 400 s. The chromaticity CIE y for an LED-filament lamp comprising CASN phosphor decreases ($\Delta$ CIE y) about 0.0022 (0.4282→0.4260) during the stabilization period.

Compared with an LED-filament lamp comprising a CASN phosphor, it can be seen (FIGS. 7 to 11 and Table 2) that LED-filaments and LED-filament lamps in accordance with the invention comprising a CSS phosphor can increase CRI Ra by about six and generate light emission with a CRI Ra of about 90. Moreover, as can be seen from Table 2, LED-filaments and LED-filament lamps in accordance with the invention comprising a CSS phosphor (~20) can increase CRI R9 by about fifteen compared with an LED-filament lamp comprising a CASN phosphor (~4.8). It is indicated in FIGS. 7 and 8 and Table 2 that use of a CSS phosphor can result in a small decrease in luminous flux (~3%) and luminous efficacy (~1%). However, these decreases are negligible compared with the significant increase in CRI Ra and CRI R9 and such decreases are generally acceptable in LED-filament lamps where quality of light matters more than overall light emission brightness. Moreover, as can be seen from FIGS. 10 and 11, LED-filaments and LED-filament lamps in accordance with the invention comprising a CSS phosphor have a more stable chromaticity (quality of light color) during the stabilization period from lamp turn-on compared with LED-filament lamps comprising a CASN phosphor. In summary, measured test data shows that LED-filaments and LED-filament lamps in accordance with the invention comprising a CSS phosphor can generate light with a CRI Ra of about 90, significantly increase CRI R9, have a more stable chromaticity during a stabilization period after turn-on and have substantially the same performance and efficacy as LED-filament lamps comprising a CASN phosphor.

Table 3 tabulates measured test data for a nominal 800 lm, 2700 K, 90 CRI Ra, Six LED-filament A19 lamp with LED-filaments comprising GAL520+CSS626 at i) 20 seconds after lamp turn-on and ii) 15 minutes after lamp turn-on (i.e. once stabilized). It can be seen from Table 3, that as with the test data for a four LED-filament A19 lamp discussed above, a Six LED-filament lamp in accordance with the invention can generate light with a CRI Ra of about 90 (~88) and a CRI R9 of about 20.

TABLE 3

Measured test data for a nominal 800 lm, 2700K, 90 CRI Ra, Six LED-filament A19 Lamp with LED-filaments comprising GAL520 + CSS626

| Time after lamp turn-on | Power (W) | Flux (lm) | Efficacy (lm/W) | CIE x | CIE y | CCT (K) | CRI Ra | R9 |
|---|---|---|---|---|---|---|---|---|
| 20 seconds | 7.02 | 931.5 | 132.74 | 0.4662 | 0.4198 | 2683 | 89.7 | 27.3 |
| 15 minutes | 6.85 | 847.5 | 123.77 | 0.4575 | 0.4200 | 2806 | 88.3 | 20.3 |

Figure 12:
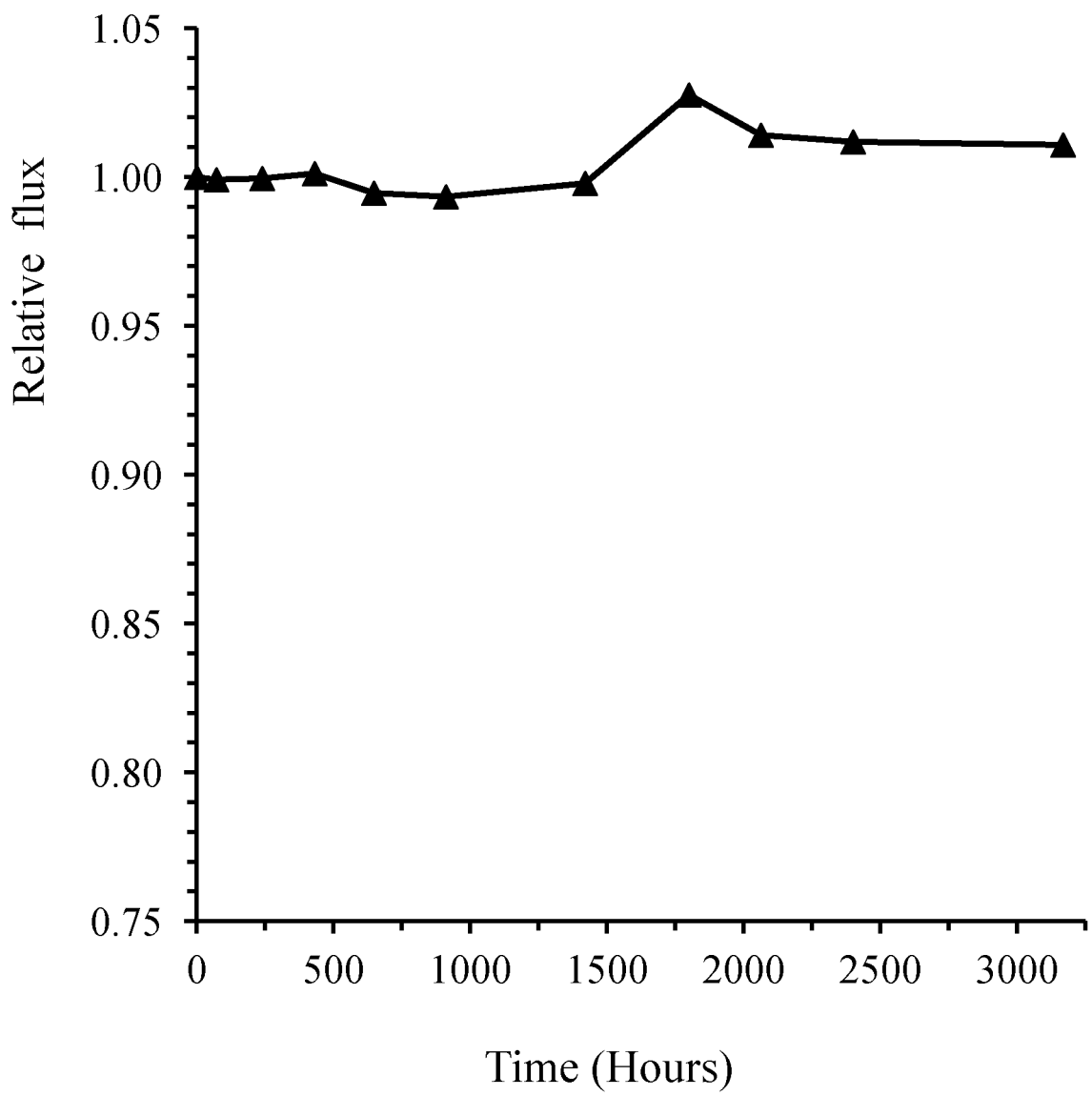
FIG. 12 shows reliability data, relative luminous flux (%) versus time (hours), for a four LED-filament A19 lamp with LED-filaments comprising green aluminate phosphor (GAL535)+narrow-band red phosphor (CSS628)
Figure 13:
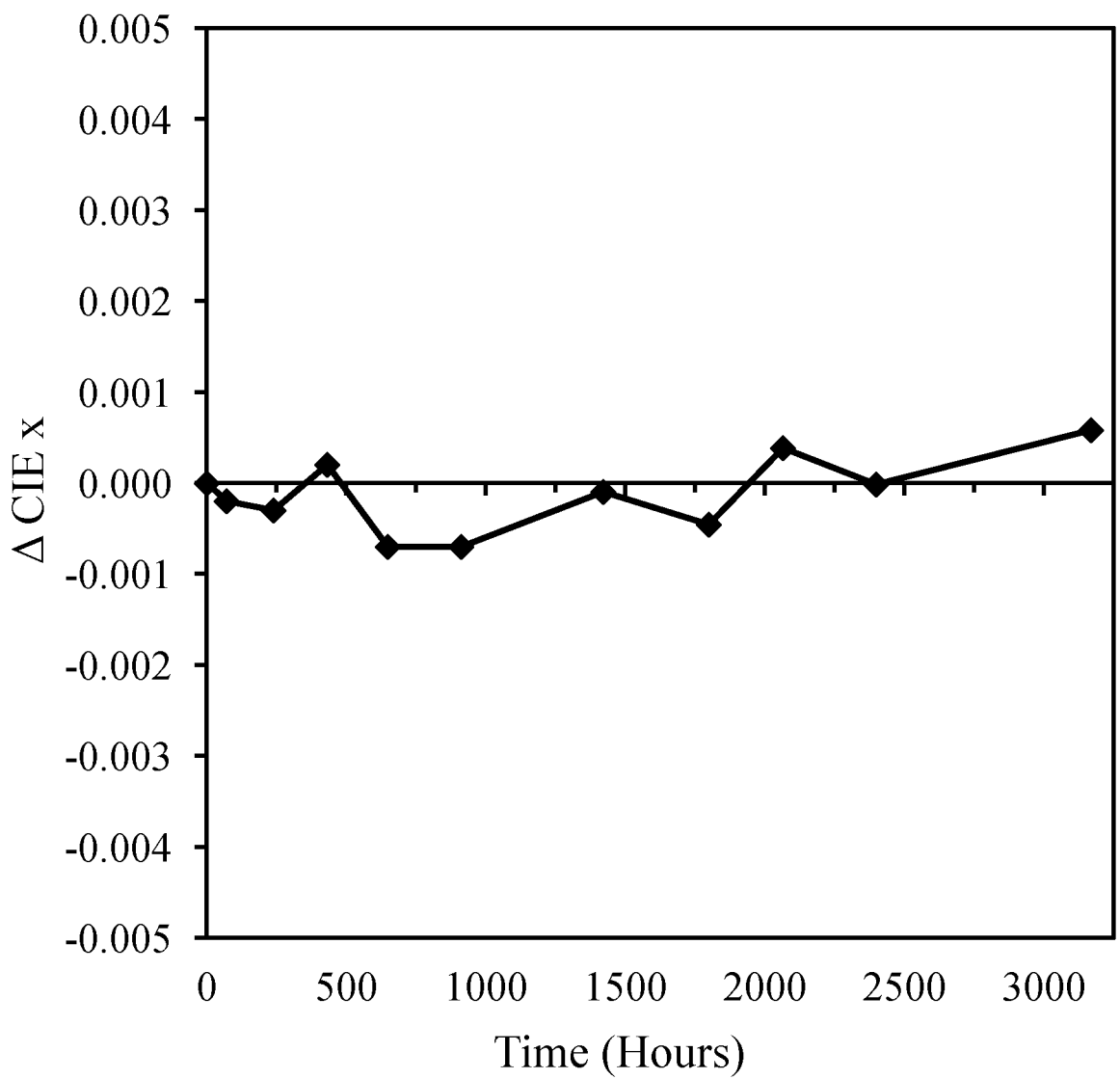
FIG. 13 shows reliability data, change of chromaticity ACIE x versus time (hours), for a four LED-filament A19 lamp with LED-filaments comprising green aluminate phosphor (GAL535)+narrow-band red phosphor (CSS628)
Figure 14:
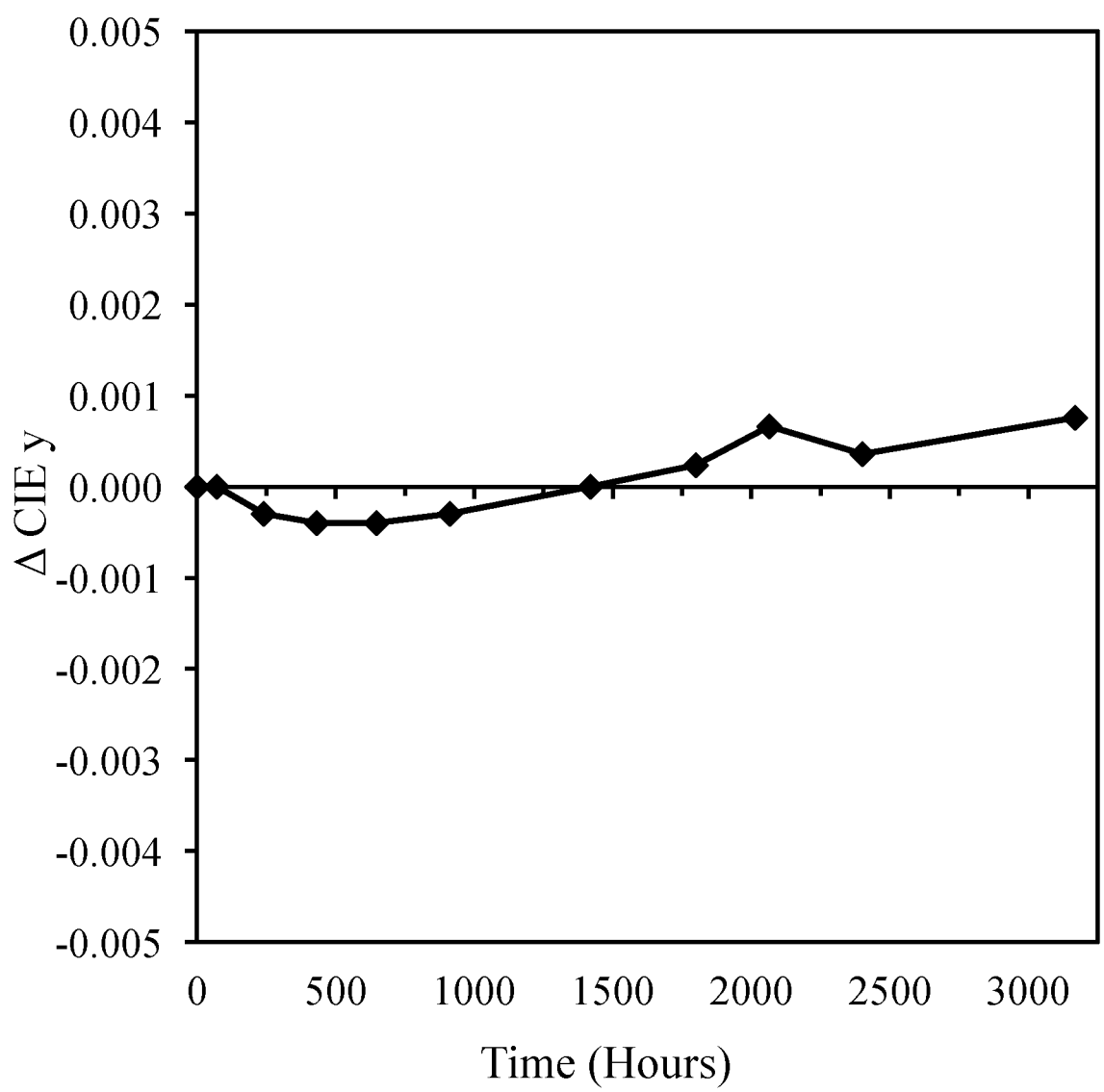
FIG. 14 shows reliability data, change of chromaticity ACIE y versus time (hours), for a four LED-filament A19 lamp with LED-filaments comprising green aluminate phosphor (GAL535)+narrow-band red phosphor (CSS628)

Table 4 tabulates measured test data for a nominal 500 lm, 2700 K, 90 CRI Ra, four LED-filament A19 lamp with LED-filaments comprising GAL535+CS S628 at i) 20 seconds after lamp turn-on and ii) 15 minutes after lamp turn-on (i.e. once stabilized). FIGS. 12-14 show reliability data for the four LED-filament A19 lamp of Table 4 (i.e. LED-filaments comprising GAL535+CSS628) operated at an ambient temperature of 25° C. FIG. 12 shows relative luminous flux versus time (hours). The relative luminous flux is the luminous flux at time t compared with the luminous flux at t=15 minutes (i.e. once lamp has stabilized after initial turn-on). FIG. 13 shows change of chromaticity Δ CIE x versus time (hours) and FIG. 14 shows change of chromaticity Δ CIE y versus time (hours). The change of chromaticity Δ CIE x, Δ CIE y is the chromaticity and time t compared with the chromaticity at time t=15 minutes. As can be seen from FIG. 12, the relative luminous flux changes less than ±2% over 3000 hours of operation. FIGS. 13 and 14 indicate that the chromaticity (quality of light color) of light generated by the lamp is very stable over 3000 hours of operation with changes in CIE x and CIE y of less than ±0.001.

TABLE 4

Measured test data for a nominal 500 lm, 2700K, 90 CRI, 25 CRI R9 Four LED-filament A19 Lamp with LED-filaments comprising GAL535 + CSS628

| Time after lamp turn-on | Power (W) | Flux (lm) | Efficacy (lm/W) | CIE x | CIE y | CCT (K) | CRI Ra | R9 |
|---|---|---|---|---|---|---|---|---|
| 15 seconds | 4.00 | 570.3 | 142.6 | 0.4754 | 0.4208 | 2572 | 90.0 | 28.9 |
| 15 minutes | 3.92 | 529.7 | 135.1 | 0.4670 | 0.4211 | 2684 | 88.4 | 22.3 |

LED-Filament Lamp Test Data: B11 Lamp

Tables 5 to 8 tabulate measured test data for various four LED-filament B11 lamps in accordance with the invention. Table 5 tabulates measured test data for B11 lamps (Samples 1 and 2) with LED-filaments in accordance with the invention comprising GAL535+CSS634. It should be noted from Table 5 that by using a single CSS phosphor with a longer peak emission wavelength (634 nm), it is possible to generate light with a CRI R9 greater than 50 and a CRI Ra greater than 90.

TABLE 5

Measured Test data for nominal 2700K, 90 CRI Ra, Four LED-filament B11 Lamps with LED-filaments comprising: GAL535 + CSS634

| Sample | Power (W) | Flux (lm) | Efficacy (lm/W) | CIE x | CIE y | CCT (K) | CRI Ra | R9 |
|---|---|---|---|---|---|---|---|---|
| 1 | 4.04 | 439.8 | 108.8 | 0.4602 | 0.4234 | 2793 | 93.0 | 55.0 |
| 2 | 4.00 | 443.2 | 110.9 | 0.4622 | 0.4238 | 2769 | 93.3 | 54.5 |
| Average | 4.02 | 441.5 | 109.9 | 0.4612 | 0.4236 | 2781 | 93.2 | 54.8 |

Table 6 tabulates measured test data for B11 lamps (Samples 1-3) with LED-filaments in accordance with the invention comprising GAL535+mixture of 90 wt. % CSS626 and 10 wt. % CSS634.

TABLE 6

Measured test data for nominal 450 lm, 2700K, 90 CRI Ra, Four LED-filament B11 Lamps with LED-filaments comprising: GAL535 + mixture of 90 wt. % CSS626 & 10 wt. % CSS634

| Sample | Power (W) | Flux (lm) | Efficacy (lm/W) | CIE x | CIE y | CCT (K) | CRI Ra | R9 |
|---|---|---|---|---|---|---|---|---|
| 1 | 4.05 | 468.4 | 115.7 | 0.4613 | 0.4217 | 2765 | 90.0 | 33.7 |
| 2 | 4.01 | 463.1 | 115.5 | 0.4610 | 0.4225 | 2776 | 90.0 | 34.0 |
| 3 | 4.02 | 463.7 | 115.5 | 0.4619 | 0.4206 | 2748 | 90.1 | 35.1 |

Table 7 tabulates measured test data for B11 lamps (Samples 1-3) with LED-filaments in accordance with the invention comprising GAL535+mixture of 70 wt. % CSS626 and 30 wt. % CSS634.

TABLE 7

Measured test data for nominal 2700K, 90 CRI Ra, Four LED-filament B11 Lamps with LED-filaments comprising: GAL535 + mixture of 70 wt. % CSS626 & 30 wt. % CSS634

| Sample | Power (W) | Flux (lm) | Efficacy (lm/W) | CIE x | CIE y | CCT (K) | CRI Ra | R9 |
|---|---|---|---|---|---|---|---|---|
| 1 | 3.31 | 382.4 | 115.7 | 0.4649 | 0.4215 | 2715 | 92.3 | 42.5 |
| 2 | 3.21 | 366.9 | 114.5 | 0.4645 | 0.4213 | 2718 | 92.4 | 43.1 |
| 3 | 3.23 | 369.5 | 114.5 | 0.4645 | 0.4212 | 2716 | 92.4 | 43.8 |
| Average | 3.25 | 372.9 | 114.9 | 0.4646 | 0.4214 | 2716 | 92.4 | 43.1 |

For ease of comparison and to illustrate the effects of using a mixture of CSS phosphors with differing peak emission wavelengths, Table 8 tabulates measured test data for B11 lamps with LED-filaments in accordance with the invention comprising i) GAL535+CSS634, ii) GAL535+ mixture of 90 wt. % CSS626 and 10 wt. % CSS634, and iii) GAL535+mixture of 70 wt. % CSS626 and 30 wt. % CSS634.

TABLE 8

Measured test data for nominal 450 lm, 2700K, 90 CRI Four LED-filament B11 Lamps: Data measured 10 minutes after lamp Turn-On (Stabilized)

| LED-filament composition | Power (W) | Flux (lm) | Efficacy (lm/W) | CIE x | CIE y | CCT (K) | CRI Ra | R9 |
|---|---|---|---|---|---|---|---|---|
| GAL535 + CSS634 | 4.02 | 441.5 | 109.8 | 0.4612 | 0.4236 | 2781 | 93.2 | 54.7 |
| GAL535 + (90 wt. % CSS626 & 10 wt. % CSS634) | 4.03 | 465.1 | 115.5 | 0.4614 | 0.4216 | 2763 | 90.0 | 34.3 |
| GAL535 + (70 wt. % CSS626 & 30 wt. % CSS634) | 3.25 | 372.9 | 114.9 | 0.4646 | 0.4213 | 2716 | 92.4 | 43.2 |

FIGS. 15-19 show measured test data versus time after lamp turn-on for a four LED-filament B11 lamp with LED-filaments comprising a mixture (blend) of at least two narrow-band red CSS phosphors with different peak emission wavelengths. Each figure also includes comparative test data for a four LED-filament B11 lamp with an LED-filament comprising a single CSS phosphor.

Figure 15:
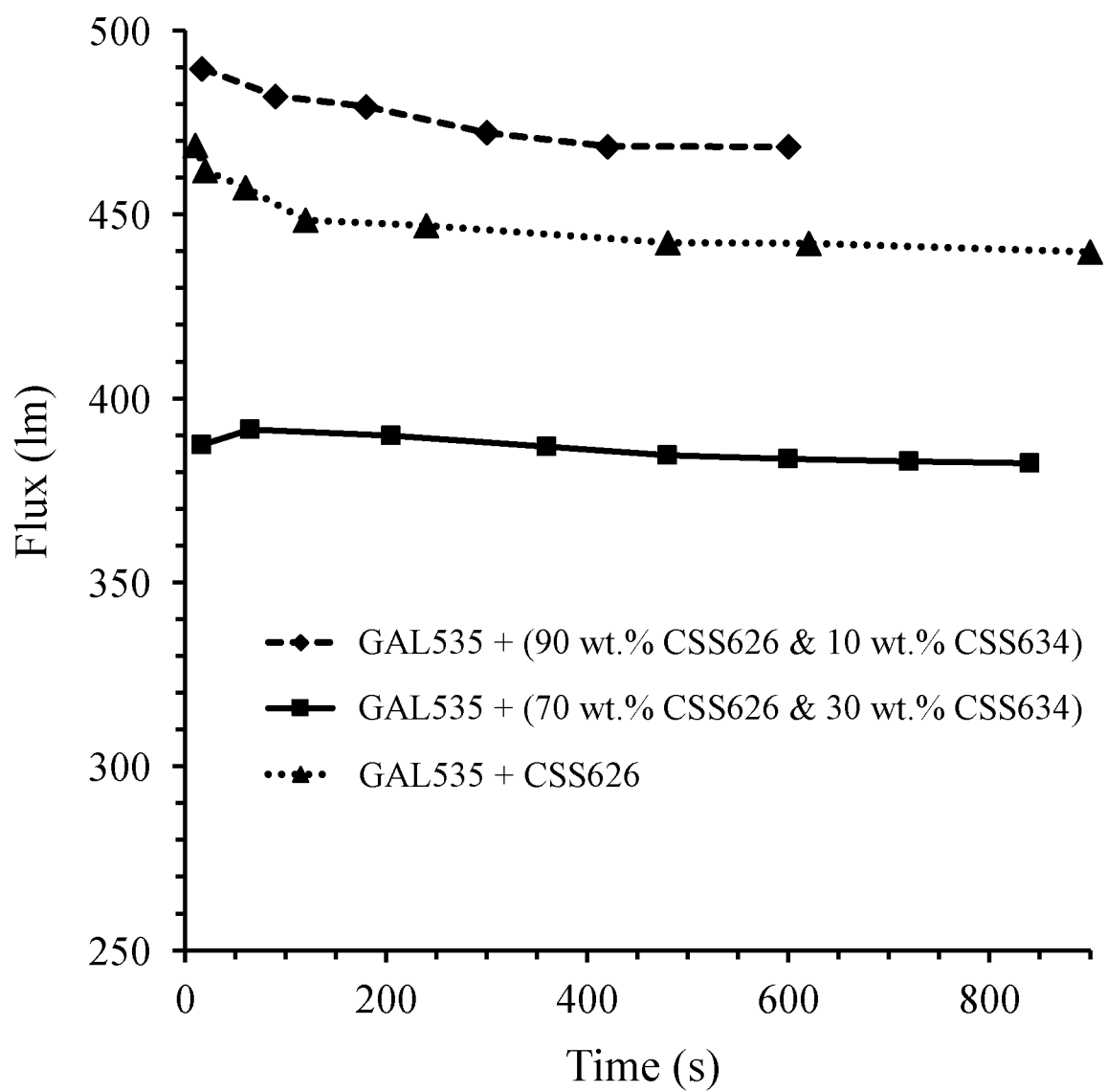
FIG. 15 shows test data, flux (lm) versus time (s) after lamp turn-on, for a four LED-filament B11 lamp with LED-filaments comprising i) green aluminate phosphor (GAL535)+narrow-band red phosphor (CSS626), ii) green aluminate phosphor (GAL535)+narrow-band red phosphor (mixture: 90 wt. % CSS626 & 10 wt. % CSS634), and iii) green aluminate phosphor (GAL535)+narrow-band red phosphor (mixture: 70 wt. % CSS626 & 30 wt. % CSS634)
Figure 16:
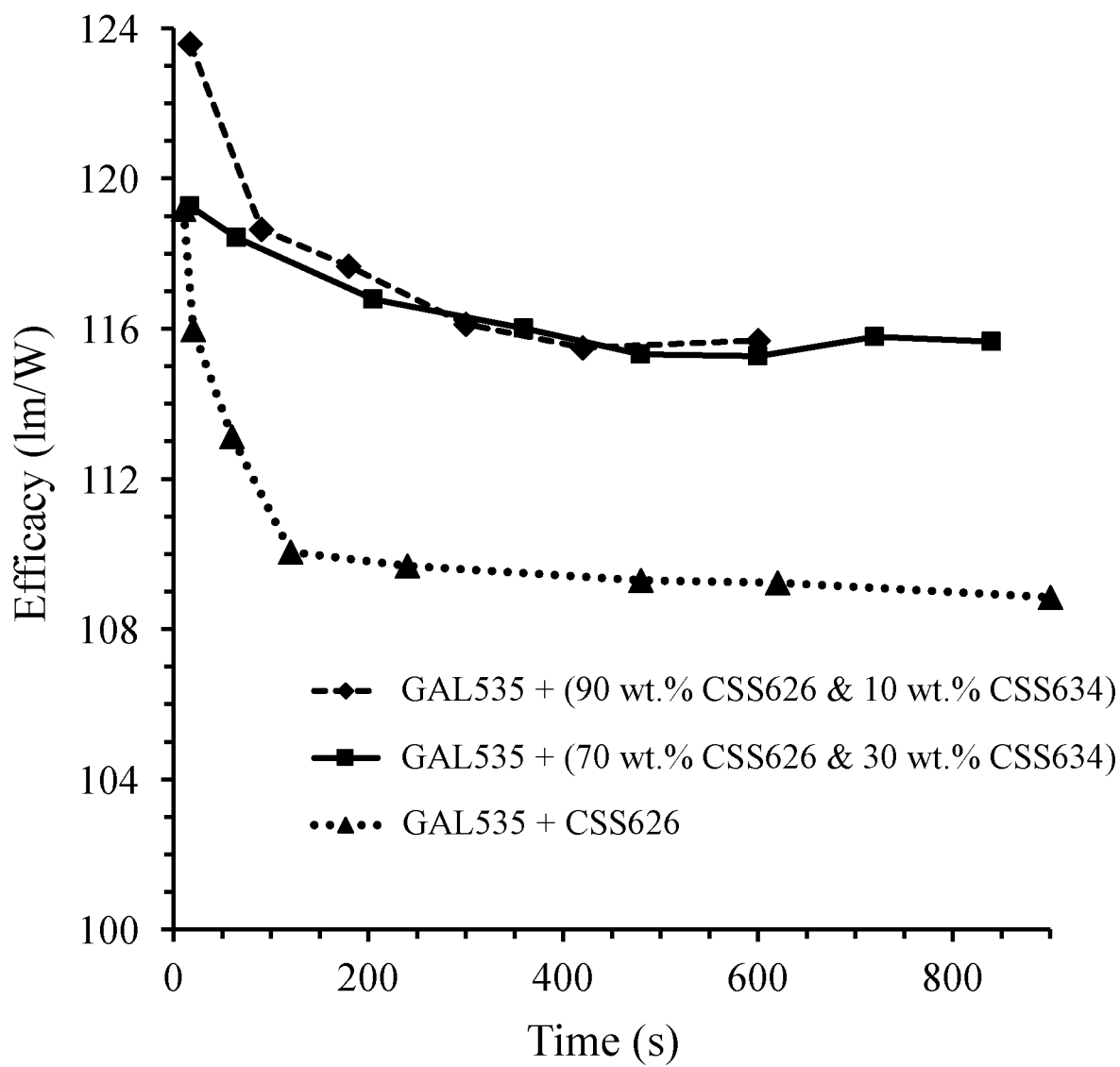
FIG. 16 shows test data, luminous efficacy (lm/W) versus time (s) after lamp turn-on, for a four LED-filament B11 lamp with LED-filaments comprising i) green aluminate phosphor (GAL535)+narrow-band red phosphor (CSS626), ii) green aluminate phosphor (GAL535)+narrow-band red phosphor (mixture: 90 wt. % CSS626 & 10 wt. % CSS634), and iii) green aluminate phosphor (GAL535)+narrow-band red phosphor (mixture: 70 wt. % CSS626 & 30 wt. % CSS634)

FIG. 15 shows measured test data, flux (lm) versus time (s) after lamp turn-on, for a four LED-filament B11 lamp with LED-filaments comprising i) GAL535+CSS626, ii) GAL535+narrow-band red phosphor (mixture of 90 wt. % CSS626 & 10 wt. % CSS634), and iii) GAL535+narrow-band red phosphor (mixture of 70 wt. % CSS626 & 30 wt. % CSS634). FIG. 16 shows measured test data, luminous efficacy (lm/W) versus time (s) after lamp turn-on, for a four LED-filament B11 lamp with LED-filaments comprising i) GAL535+CSS626, ii) GAL535+narrow-band red phosphor (mixture of 90 wt. % CSS626 & 10 wt. % CSS634), and iii) GAL535+narrow-band red phosphor (mixture of 70 wt. % CSS626 & 30 wt. % CSS634). As can be seen in FIG. 16, the luminous efficacy for LED-filament lamps comprising i) a single CSS phosphor (CSS626) and lamps comprising ii) and iii) a mixture of CSS phosphors (CSS626 & CSS634), reach a stable value after a stabilization period of about 300-500s after lamp turn-on. The luminous efficacy for i) an LED-filament lamp comprising a single CSS phosphor decreases about 8% (119 lm/W→109 lm/W) during the stabilization period, while LED-filament lamp comprising a mixture of CSS phosphors ii) and iii) respectively decrease about 7% (124 lm/W→115 lm/W) and about 3% (119 lm/W→115 lm/W) during the stabilization period. Compared with an LED-filament comprising a single CSS phosphor (CSS626), it can be seen (FIG. 16) that after stabilization an LED-filament and/or an LED-filament lamp in accordance with the invention comprising a mixture of CSS (CSS626 and CSS634) phosphors that have different peak emission wavelengths (626 nm, 634 nm) can increase the luminous efficacy of the lamp by about 5 lm/W (110→115 lm/W) that is about 5%.

Figure 17:
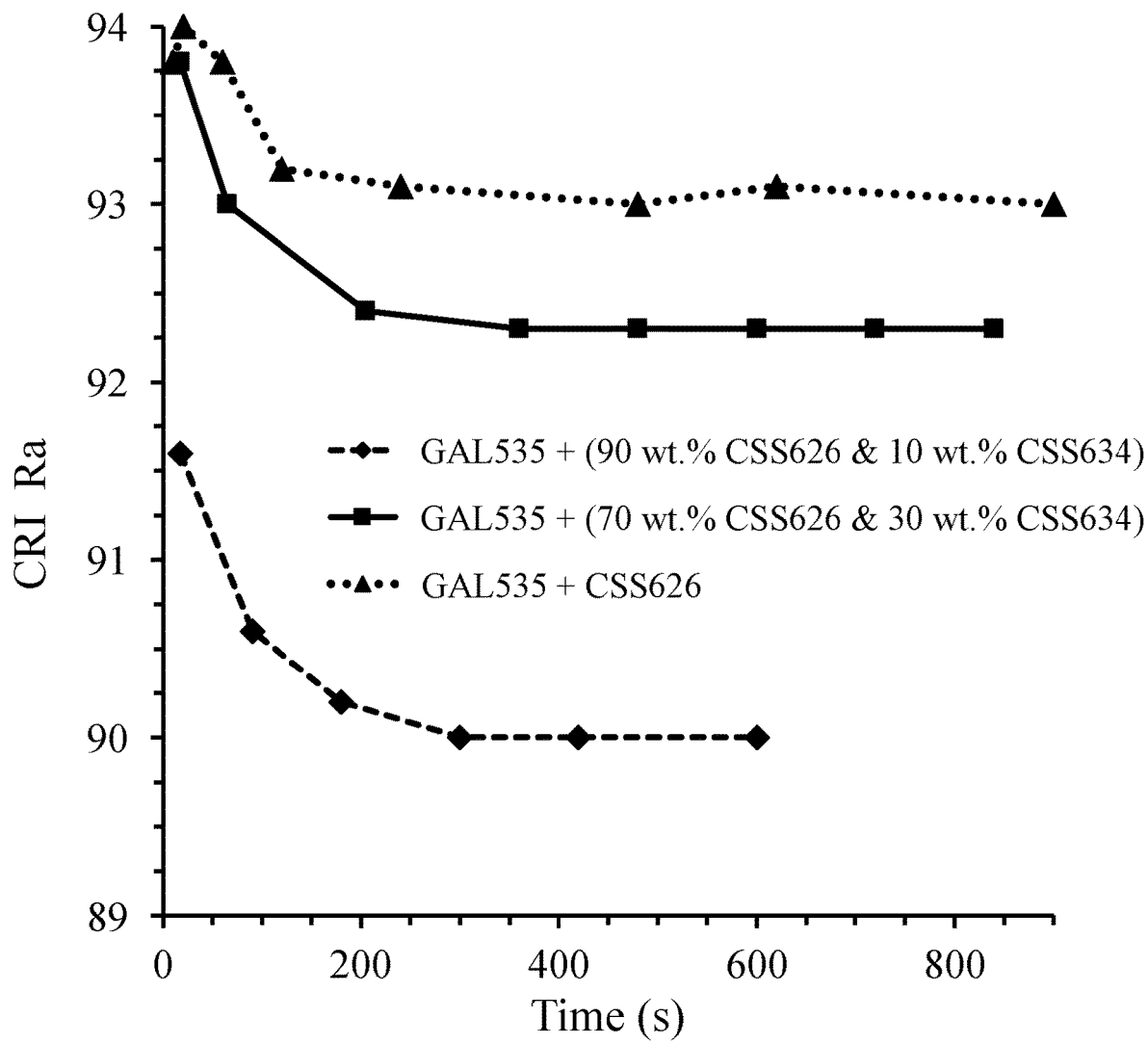
FIG. 17 shows test data, Color Rendering Index (CRI) Ra versus time (s) after lamp turn-on, for a four LED-filament B11 lamp with LED-filaments comprising i) green aluminate phosphor (GAL535)+narrow-band red phosphor (CSS626), ii) green aluminate phosphor (GAL535)+narrow-band red phosphor (mixture: 90 wt. % CSS626 & 10 wt. % CSS634), and iii) green aluminate phosphor (GAL535)+narrow-band red phosphor (mixture: 70 wt. % CSS626 & 30 wt. % CSS634)

FIG. 17 shows test data, Color Rendering Index (CRI) Ra versus time (s) after lamp turn-on, for a four LED-filament B11 lamp with LED-filaments comprising i) GAL535+ CSS626, ii) GAL535+narrow-band red phosphor (mixture 90 wt. % CSS626 & 10 wt. % CSS634), and iii) GAL535+ narrow-band red phosphor (mixture 70 wt. % CSS626 & 30 wt. % CSS634). As can be seen in FIG. 17, CRI Ra for each of the lamps reaches a stable value after about 300 and 400 s of lamp turn-on. For an LED-filament lamp comprising i) a single CSS626 phosphor CRI Ra is about 93 after stabilization while LED-filaments comprising a mixture of CSS626 & CSS634 phosphors, CRI Ra is ii) about 90.0 and iii) 92.5 respectively. It can be seen therefore from FIG. 17 that an LED-filament in accordance with the invention comprising a mixture of CSS phosphors that have different peak emission wavelengths can, compared with an LED-filament comprising a single CSS phosphor, increase the luminous efficacy of the lamp by about 5 lm/W (~5%) while still maintaining a CRI Ra of at least 90 after stabilization. Moreover, as can be seen from Table 8, this increase in luminous efficacy of the lamp is at the expense of a small decrease in CRI R9 (55→34/44).

Figure 18:
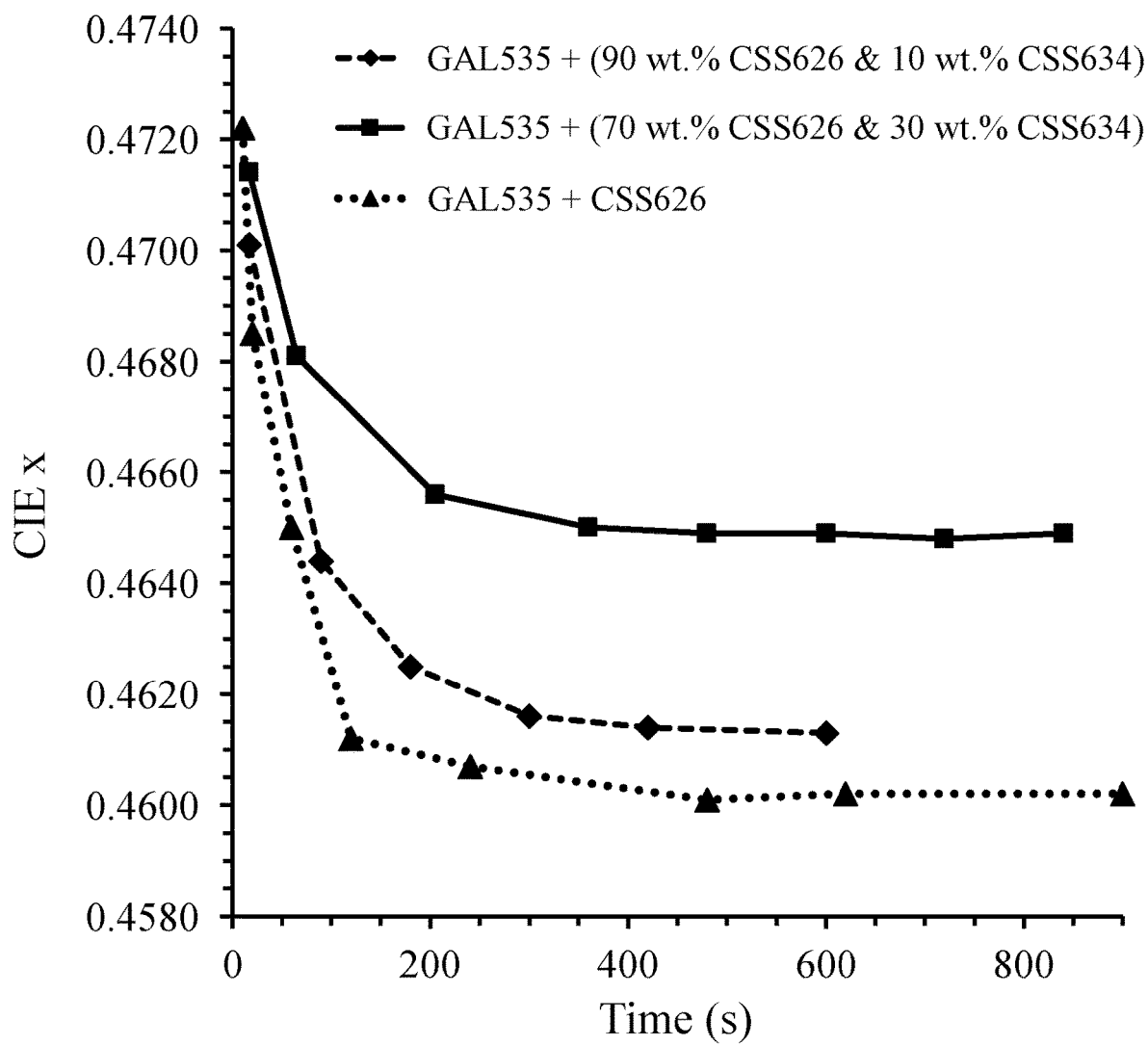
FIG. 18 shows test data, chromaticity CIE x versus time (s) after lamp turn-on, for a four LED-filament B11 lamp with LED-filaments comprising i) green aluminate phosphor (GAL535)+narrow-band red phosphor (CSS626), ii) green aluminate phosphor (GAL535)+narrow-band red phosphor (mixture: 90 wt. % CSS626 & 10 wt. % CSS634), and iii) green aluminate phosphor (GAL535)+narrow-band red phosphor (mixture: 70 wt. % CSS626 & 30 wt. % CSS634)

FIG. 18 shows test data, chromaticity CIE x versus time (s) after lamp turn-on, for a four LED-filament B11 lamp with LED-filaments comprising i) GAL535+CSS626, ii) GAL535+narrow-band red phosphor (mixture of 90 wt. % CSS626 & 10 wt. % CSS634), and iii) GAL535+narrow-band red phosphor (mixture of 70 wt. % CSS626 & 30 wt. % CSS634). As can be seen in FIG. 17, the chromaticity CIE x for LED-filament lamps comprising CSS phosphor or a mixture of CSS phosphors (CSS626 & CSS634) each reach a stable value after a stabilization period of about 200-500s. The chromaticity CIE x for LED-filament lamps comprising a mixture of CSS phosphor decreases (ΔCIE x) during the stabilization period is ii) about 0.0085, (0.4700→0.4615) and iii) about 0.0072 (0.4722→0.4650) compared with an LED-filament lamp comprising a single CSS626 phosphor in which CIE x decreases (ΔCIE x) about 0.0122 (0.4722→0.4600) during the stabilization period.

Figure 19:
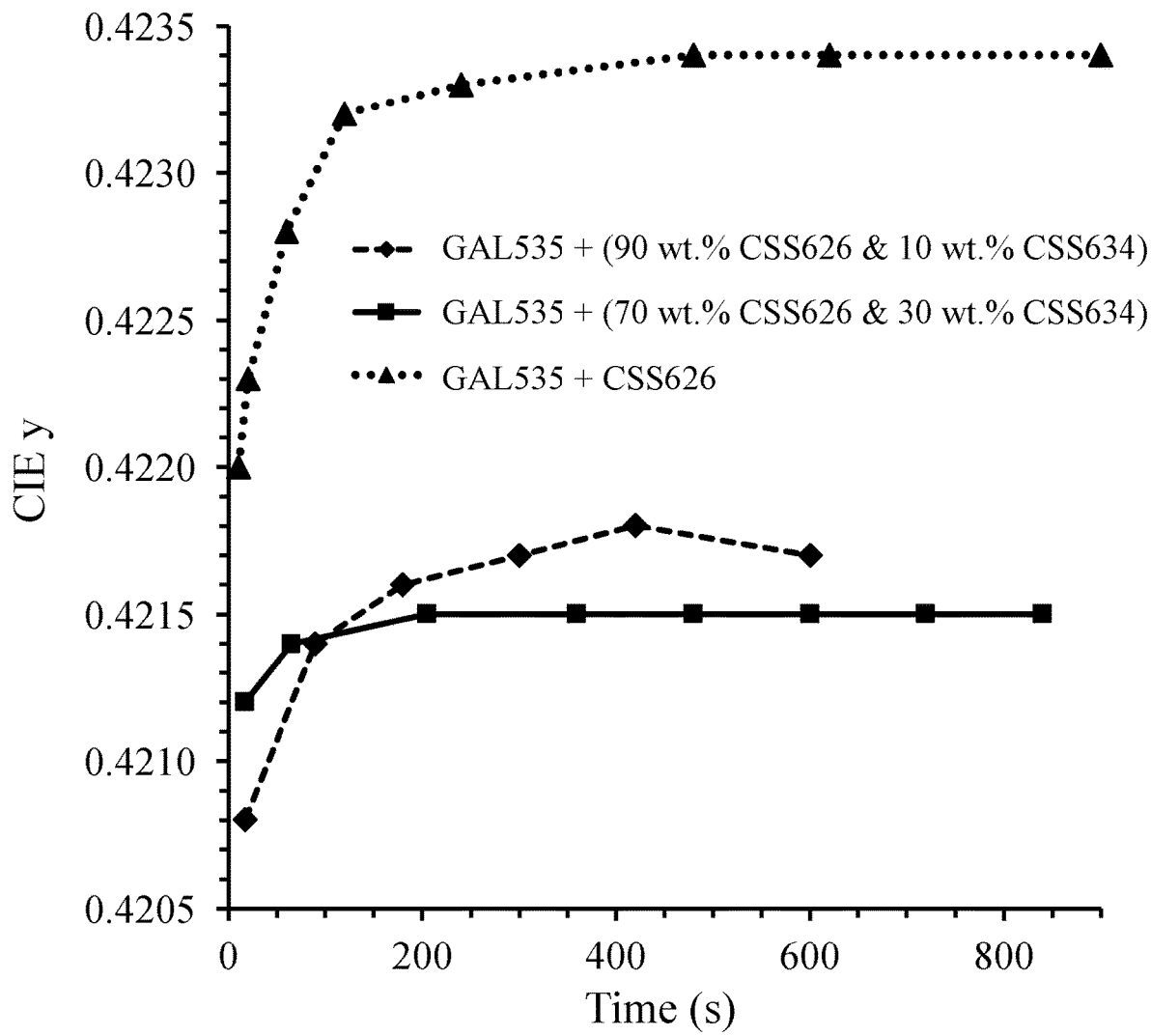
FIG. 19 shows test data, chromaticity CIE y versus time (s) after lamp turn-on, for a four LED-filament B11 lamp with LED-filaments comprising i) green aluminate phosphor (GAL535)+narrow-band red phosphor (CSS626), ii) green aluminate phosphor (GAL535)+narrow-band red phosphor (mixture: 90 wt. % CSS626 & 10 wt. % CSS634), and iii) green aluminate phosphor (GAL535)+narrow-band red phosphor (Mixture: 70 wt. % CSS626 & 30 wt. % CSS634).

FIG. 19 shows test data, chromaticity CIE y versus time (s) after lamp turn-on, for a four LED-filament B11 lamp with LED-filaments comprising i) GAL535+narrow-band red phosphor (CSS626), ii) GAL535+narrow-band red phosphor (mixture of 90 wt. % CSS626 & 10 wt. % CSS634), and iii) GAL535+narrow-band red phosphor (mixture of 70 wt. % CSS626 & 30 wt. % CSS634). As can be seen in FIG. 19, the chromaticity CIE y for LED-filament lamps comprising CSS phosphor or a mixture of CSS phosphors (CSS626 & CSS634) stabilize after a stabilization period of about 200-500 s. The chromaticity CIE y for a LED-filament lamps comprising a mixture of CSS phosphor increase (ΔCIE y) during the stabilization period ii) about 0.0009 (0.4208→0.4217) and iii) 0.0003 (0.4212→0.4215), compared with an LED-filament lamp comprising a single CSS626 phosphor in which CIE y increases (ΔCIE y) about 0.0014 (0.4220→0.4234) during the stabilization period. As can be seen from FIGS. 18-19, LED-filaments and LED-filament lamps in accordance with the invention comprising a mixture of at least two CSS phosphors, have a more stable chromaticity CIE x and CIE y (quality of light color) during the stabilization period after lamp turn-on compared with an LED-filament/lamp comprising a single CSS phosphor.

In summary, LED-filaments and/or LED-filament lamps in accordance with the invention that comprise a mixture of at least two narrow-band red phosphors having different peak emission wavelengths can, compared with an LED-filament comprising a single narrow-band red phosphor, have a more stable chromaticity (quality of light color) during the stabilization period after lamp turn-on, increase the luminous efficacy of the lamp while still maintaining a CRI Ra of at least 90 and with only a small decrease in CRI R9.

Comparative Data Using Cavity Phosphor Test

Tables 9 to 12 tabulate measured phosphor cavity test data to show the effect of red phosphor composition. The cavity test method involves mixing the phosphor powder with an uncurable optical encapsulant and placing the mixture in a cavity containing a blue LED (dominant wavelength 452 nm) and measuring total light emission in an integrating sphere. The data in these tables further illustrates the benefits of using a mixture of CSS phosphor(s) as compared with using a CASN phosphor in LED-filament applications having a CRI Ra of at least 90.

Table 9 tabulates measured test data for a 5630 (5.6×3.0 mm package) cavity comprising i) GAL535+CASN628, ii) GAL535+CASN630, and iii) GAL535+CASN640 and illustrates the effects of red phosphor composition on relative luminous flux (%), CRI Ra and CRI R9. As can be seen from Table 9, use of CASN phosphor with an increasingly longer peak emission wavelength (628 nm, 630 nm, 640 nm) can simultaneously increase CRI Ra from about 83 to about 92 and CRI R9 from about 8 to about 59. However, in the process of increasing CRI Ra to 90, the relative luminous flux (Brightness) drops by a massive 22%.

TABLE 9

5630 cavity comparing CRI Ra 80 and CRI Ra 90 devices

| Composition | Relative | | | CRI | |
|---|---|---|---|---|---|
| | Flux (lm) | Flux (%) | CCT (K) | Ra | R9 |
| GAL535 + CASN628 | 103.4 | 100.0 | 2628 | 83.3 | 7.6 |
| GAL535 + CASN630 | 100.5 | 97.2 | 2700 | 84.6 | 14.9 |
| GAL535 + CASN646 | 84.9 | 78.3 | 2700 | 92.1 | 59.3 |

Table 10 tabulates measured test data for a 2835 (2.8×3.5 mm package) cavity comprising i) GAL535+CASN628, and ii) GAL535+CASN645 and illustrates the effects of a red phosphor composition on relative luminous flux (%), CRI Ra and CRI R9. Table 10 indicates that use of CASN phosphor with a longer peak emission wavelength (628 nm→645 nm) can simultaneously increase CRI Ra from about 83 to about 88 and can increase CRI R9 from about 6 to about 48. However, and consistent with the data for a 5630 cavity (Table 9), in the process of increasing CRI Ra to 90, the luminous flux drops by a massive 18%.

TABLE 10

2835 cavity illustrating effect of red phosphor composition on Brightness, CRI Ra and CRI R9

| Composition | Power (mW) | Flux (lm) | Efficacy (lm/W) | Relative Flux (%) | CIE x | CIE y | CCT (K) | CRI Ra | CRI R9 |
|---|---|---|---|---|---|---|---|---|---|
| GAL535 + CSS628 | 181.2 | 16.8 | 113.3 | 100.0 | 0.4343 | 0.4125 | 3114 | 82.7 | 5.9 |
| GAL535 + CASN645 | 180.6 | 20.5 | 93.0 | 81.8 | 0.4366 | 0.4160 | 3102 | 88.1 | 48.4 |

Table 11 tabulates measured test data for a 5630 cavity comprising i) GAL535+CSS626, ii) GAL535+mixture of 90 wt. % CSS626 & 10 wt. % CSS634, and iii) GAL535+ mixture of 80 wt. % CSS626 & 20 wt. % CSS634 and illustrates the effects of a red phosphor composition on relative luminous flux (%), CRI Ra and CRI R9.

TABLE 11

5630 cavity illustrating effect of red phosphor composition on Brightness, CRI Ra and CRI R9

| Composition | Flux (lm) | Relative Flux (%) | CIE x | CIE y | CCT (K) | CRI | R9 |
|---|---|---|---|---|---|---|---|
| GAL535 + CSS626 | 13.02 | 100.0 | 0.4596 | 0.4098 | 2698 | 91.0 | 34.4 |
| GAL535 + (90 wt. % CSS626 & 10 wt. % CSS634) | 12.86 | 98.8 | 0.4603 | 0.4108 | 2696 | 92.3 | 41.6 |
| GAL535 + (80 wt. % CSS626 & 20 wt. % CSS634) | 12.74 | 97.8 | 0.4603 | 0.4115 | 2701 | 92.9 | 44.7 |

Table 12 tabulates measured test data for a 5630 cavity comprising i) GAL535+CSS626 and ii) GAL535+mixture of 70 wt. % CSS626 & 30 wt. % CSS634 and illustrates the effects of red phosphor composition on relative luminous flux (%), CRI Ra and CRI R9.

TABLE 12

5630 cavity illustrating effect of red phosphor composition on Brightness, CRI Ra and CRI R9

| Composition | Flux (lm) | Relative Flux (%) | CIE x | CIE y | CCT (K) | CRI Ra | CRI R9 |
|---|---|---|---|---|---|---|---|
| GAL535 + CSS626 | 12.45 | 100.0 | 0.4607 | 0.4154 | 2725 | 90.0 | 31.0 |
| GAL535 + (70 wt. % CSS626 & 30 wt. % CSS634) | 12.10 | 97.2 | 0.4603 | 0.4131 | 2712 | 94.1 | 52.7 |

As can be seen from Tables 11 and 12, use of a mixture of CSS626 and CSS634 phosphors with an increasingly weight proportion of CSS634 (10%, 20%, 30%) can simultaneously increase CRI Ra from about 90 to about 94 and CRI R9 from about 31 to about 53. However, and in contrast to the data for CASN phosphors (Tables 9 and 10) the use of a mixture of CSS phosphors enables CRI Ra and CRI R9 to be increased with only a small drop in relative luminous flux (Brightness) of less than about 3%.

In summary, the foregoing description shows that LED-filaments and LED-filament lamps comprising a narrow-band red phosphor, such as a CSS phosphor, are capable of generating light having i) a CRI Ra of 90 and greater, ii) a CRI R9 up to about 55, and iii) a more stable chromaticity (quality of light color) during a stabilization period after turn-on while having substantially the same efficacy as LED-filament lamps comprising a CASN phosphor. This result is surprising since CSS phosphors are known to have poor reliability and problems related to thermal quenching and blue quenching. For these reasons, such phosphors are not used in LED applications. It is postulated that in an LED-filament, that comprises multiple low power LED chips (e.g. 15×16 mW LED-chips per filament), the blue power density is lower compared with an LED device comprising a single LED chip (e.g. 1 W) resulting in a reduction of blue quenching. Moreover, it is postulated that since LED-filament lamps often comprise an inert gas such as helium, this may result in lower operating temperature than expected and that this results in a reduction of thermal quenching. It is believed that it may be a combination of these factors that account for the unexpectedly good performance of CSS phosphors within LED-filaments and LED-filament lamps.

Although the present invention has been particularly described with reference to certain embodiments thereof, it should be apparent to those of ordinary skill in the art that changes and modifications in the form and details may be made without departing from the spirit and scope of the invention. For example, while the LED-filaments and lamps are described herein as comprising CSS narrow-band red phosphors, in other embodiments the narrow-band red phosphors can comprise other materials having the same emission characteristics, namely generate light with a peak emission wavelength in a range of 600 nm to 640 nm and a full width at half maximum emission intensity of 50 nm to 60 nm.

LED-filaments in accordance with the invention find application in other bulb types such as general mushroom, elliptical, (E)and sign (S) bulb designs and decorative twisted candle, bent-tip candle (CA and BA), flame (F), globe (G), lantern chimney (H) and fancy round (P) bulb designs.

While the present invention is described in relation to LED-filaments and LED-filament lamps, it is found that narrow-band red phosphor, in particular Group IIA/IIB selenide sulfide-based phosphor material such as for example $CaSe_{1-x}S_x$: Eu (CSS) phosphor materials, have utility in other types of light emitting devices such as packaged LEDs to achieve a CRI Ra of 90 and higher with only a negligible impact on performance. To reduce blue quenching which impacts device performance (in particular efficacy), such packaged devices should have a low blue photon power density compared with known devices and can comprise for example multiple low power LED chips and/or devices in which the phosphor is distributed over a greater area than the known devices. Moreover, to reduce thermal quenching degrading device performance (in particular efficacy) the device package preferably has a superior thermal performance.

What is claimed is:

1. An LED-filament comprising:
an at least partially light-transmissive substrate;
a plurality of blue LED chips on said light-transmissive substrate; and
a photoluminescence material covering said plurality of blue LED chips,
wherein said photoluminescence material comprises narrow-band red phosphor particles of general composition $MSei_{1-x}S_x$: Eu in which M is at least one of Mg, Ca, Sr, Ba and Zn and $0<x<1.0$.

2. The LED-filament of claim 1, wherein said narrow-band red phosphor particles generate light with a peak emission wavelength from 600 nm to 640 nm and a full width at half maximum emission intensity from about 48 nm to about 60 nm.

3. The LED-filament of claim 1, wherein the LED-filament generates white light with a color temperature from 1500 K to 6500 K and has a luminous efficacy from about 110 lm/W to about 140 lm/W.

4. The LED-filament of claim 3, wherein said white light has at least one of: a CRI R8 of at least 72, a CRI R9 of at least 50, and CRI Ra of at least 90.

5. An LED-filament comprising:
an at least partially light-transmissive substrate;
a plurality of blue LED chips on said light-transmissive substrate; and
a photoluminescence material at least partially covering said plurality of blue LED chips, wherein said photoluminescence material comprises narrow-band red phosphor particles of general composition $MSe_{1-x}S_x$: Eu in which M is at least one of Mg, Ca, Sr, Ba and $0<x<1.0$ and wherein individual ones of said narrow-band red phosphor particles comprise an impermeable coating.

6. The LED-filament of claim 5, wherein said impermeable coating comprises one or more materials selected from the group consisting of: amorphous alumina, aluminum oxide, silicon oxide, titanium oxide, zinc oxide, magnesium oxide, zirconium oxide, boron oxide, chromium oxide, calcium fluoride, magnesium fluoride, zinc fluoride, aluminum fluoride and titanium fluoride.

7. The LED-filament of claim 5, wherein said narrow-band red phosphor particles generate light with a peak emission wavelength from 600 nm to 640 nm and a full width at half maximum emission intensity from about 48 nm to about 60 nm.

8. The LED-filament of claim 5, wherein the LED-filament generates white light with a color temperature from 1500 K to 6500 K and has a luminous efficacy from about 110 lm/W to about 140 lm/W.

9. The LED-filament of claim 8, wherein said white light has at least one of: a CRI R8 of at least 72, a CRI R9 of at least 50, and CRI Ra of at least 90.

10. The LED-filament of claim 5, wherein the LED-filament satisfies at least one of:
after 3000 hours of operation at 25° C., luminous flux generated by the device is at least 98% of a starting luminous flux;
after 3000 hours of operation at 25° C. a change in at least one of CIE x and CIE y is less than 0.001; and
after reaching stable operation after about 400 seconds from turn on luminous flux is 94% of the value at turn on.

11. An LED-filament comprising:
an at least partially light-transmissive substrate;
a plurality of blue LED chips on said light-transmissive substrate; and
a photoluminescence material covering the plurality of blue LED chips, said photoluminescence material comprising:
narrow-band red phosphor particles that generate red light with a peak emission wavelength from 600 nm to 640 nm and a full width at half maximum emission intensity from about 48 nm to about 60 nm; and
yellow to green-emitting phosphor particles that generates yellow to green light with a peak emission wavelength from 520 nm to 570 nm;
wherein the LED-filament generates white light with a color temperature from 1500 K to 6500 K and at least one of: a CRI R8 of at least 72, and a luminous efficacy from about 110 lm/W to about 140 lm/W.

12. The LED-filament of claim 11, wherein said LED-filament generates white light with at least one of: a CRI R9 of at least 50, and CRI Ra of at least 90.

13. The LED-filament of claim 11, wherein said narrow-band red phosphor particles of general composition $MSe_{1-x}S_x$: Eu, wherein M is at least one of Mg, Ca, Sr, Ba and Zn and $0<x<1.0$.

* * * * *

UNITED STATES PATENT AND TRADEMARK OFFICE
CERTIFICATE OF CORRECTION

PATENT NO. : 11,050,003 B2  
APPLICATION NO. : 16/742910  
DATED : June 29, 2021  
INVENTOR(S) : Li et al.

Page 1 of 1

It is certified that error appears in the above-identified patent and that said Letters Patent is hereby corrected as shown below:

In the Claims

Column 27, Line 36, that formula reading:  
-MSei$_{1-x}$S$_x$-  
Should read:  
--MSe$_{1-x}$S$_x$--

Signed and Sealed this  
Tenth Day of August, 2021

Drew Hirshfeld  
*Performing the Functions and Duties of the*  
*Under Secretary of Commerce for Intellectual Property and*  
*Director of the United States Patent and Trademark Office*